(12) United States Patent
Goto et al.

(10) Patent No.: US 11,829,025 B2
(45) Date of Patent: Nov. 28, 2023

(54) COMPOSITION, OPTICALLY ANISOTROPIC FILM, CIRCULARLY POLARIZING PLATE, DISPLAY DEVICE, AND NEAR-INFRARED ABSORBING COLORING AGENT

(71) Applicant: FUJIFILM Corporation, Tokyo (JP)

(72) Inventors: Ryoji Goto, Kanagawa (JP); Kiyoshi Takeuchi, Kanagawa (JP); Yoshitaka Maeda, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 122 days.

(21) Appl. No.: 17/411,515

(22) Filed: Aug. 25, 2021

(65) Prior Publication Data

US 2021/0382349 A1    Dec. 9, 2021

Related U.S. Application Data

(63) Continuation of application No. PCT/JP2020/007401, filed on Feb. 25, 2020.

(30) Foreign Application Priority Data

Feb. 27, 2019    (JP) .................................. 2019-034754

(51) Int. Cl.
    *G02F 1/13363*    (2006.01)
    *G02F 1/1335*    (2006.01)
    (Continued)

(52) U.S. Cl.
    CPC .......... *G02F 1/133541* (2021.01); *C07F 5/02* (2013.01); *C09K 19/38* (2013.01);
    (Continued)

(58) Field of Classification Search
    CPC ................ G02B 5/3016; G02B 5/3083; C09K 19/3861; C09K 19/60; C09K 19/3477;
    (Continued)

(56) References Cited

U.S. PATENT DOCUMENTS

2010/0045901 A1    2/2010    Uehira et al.
2011/0070407 A1*   3/2011    Kato ..................... C09B 57/004
                                                       428/172
(Continued)

FOREIGN PATENT DOCUMENTS

JP    2008-273925 A    11/2008
JP    2018-025770 A     2/2018
(Continued)

OTHER PUBLICATIONS

International Search Report issued in PCT/JP2020/007401 dated May 26, 2020.
(Continued)

*Primary Examiner* — Ruiyun Zhang
(74) *Attorney, Agent, or Firm* — Edwards Neils LLC; Jean C. Edwards, Esq.

(57) ABSTRACT

The present invention provides a composition to form an optically anisotropic film exhibiting excellent reverse wavelength dispersibility, an optically anisotropic film, a circularly polarizing plate; a display device; and a near-infrared absorbing coloring agent. The composition includes a liquid crystal compound or a polymer, and a near-infrared absorbing coloring agent having a structural moiety including a coloring agent skeleton and a mesogenic group that is bonded to the coloring agent skeleton, in which the near-infrared absorbing coloring agent satisfies Condition 1 where an absolute value λ1 of a square root of a first eigenvalue and an absolute value λ2 of a square root of a second eigenvalue satisfy a relationship of Formula (A) λ2/λ1≤0.60; and Condition 2: An angle between a direction of a transition moment of absorption of the infrared absorbing coloring agent and a direction of an eigenvector of the first eigenvalue is 75.0° or more.

20 Claims, 3 Drawing Sheets

(51) Int. Cl.
*C07F 5/02* (2006.01)
*C09K 19/38* (2006.01)
*C09K 19/04* (2006.01)

(52) U.S. Cl.
CPC .......... *G02F 1/133633* (2021.01); *C09K 2019/0448* (2013.01); *C09K 2323/00* (2020.08); *C09K 2323/03* (2020.08); *C09K 2323/031* (2020.08); *G02F 2202/022* (2013.01)

(58) Field of Classification Search
CPC .......... C09K 19/348; C09K 2323/00; C09K 2323/03; C09K 2323/031; G02F 1/13363; G02F 2001/133633; G02F 2001/133637
USPC .............. 428/1.1, 1.3, 1.31; 349/117
See application file for complete search history.

(56) References Cited

U.S. PATENT DOCUMENTS

| | | | |
|---|---|---|---|
| 2015/0183902 A1* | 7/2015 | Sakamoto | C09K 19/322 548/161 |
| 2019/0382555 A1 | 12/2019 | Matsumura et al. | |
| 2020/0013835 A1 | 1/2020 | Muramatsu et al. | |
| 2020/0079885 A1 | 3/2020 | Tamura et al. | |
| 2020/0140758 A1 | 5/2020 | Shimamura et al. | |
| 2020/0140759 A1 | 5/2020 | Shimamura et al. | |
| 2020/0174171 A1 | 6/2020 | Nishikawa et al. | |
| 2021/0026062 A1 | 1/2021 | Sato et al. | |

FOREIGN PATENT DOCUMENTS

| | | | |
|---|---|---|---|
| JP | 2018045011 A | * | 3/2018 |
| WO | 2018/020861 A1 | | 2/2018 |
| WO | 2018/159235 A1 | | 9/2018 |
| WO | 2018/174015 A1 | | 9/2018 |
| WO | 2018/216812 A1 | | 11/2018 |
| WO | 2019/017444 A1 | | 1/2019 |
| WO | 2019/017445 A1 | | 1/2019 |
| WO | 2019/044859 A1 | | 3/2019 |
| WO | 2019/189809 A1 | | 10/2019 |

OTHER PUBLICATIONS

Written Opinion issued in PCT/JP2020/007401 dated May 26, 2020.
International Preliminary Report on Patentability completed by WIPO dated Aug. 25, 2021 in connection with International Patent Application No. PCT/JP2020/007401.

* cited by examiner

COMPOSITION, OPTICALLY ANISOTROPIC FILM, CIRCULARLY POLARIZING PLATE, DISPLAY DEVICE, AND NEAR-INFRARED ABSORBING COLORING AGENT

CROSS-REFERENCE TO RELATED APPLICATIONS

This application is a Continuation of PCT International Application No. PCT/JP2020/007401 filed on Feb. 25, 2020, which was published under PCT Article 21(2) in Japanese, and which claims priority under 35 U.S.C. § 119(a) to Japanese Patent Application No. 2019-034754 filed on Feb. 27, 2019. The above applications are hereby expressly incorporated by reference, in their entirety, into the present application.

BACKGROUND OF THE INVENTION

1. Field of the Invention

The present invention relates to a composition, an optically anisotropic film, a circularly polarizing plate, a display device, and a near-infrared absorbing coloring agent.

2. Description of the Related Art

A phase difference film having refractive index anisotropy (optically anisotropic film) has been applied to various uses such as an antireflection film of a display device, and an optical compensation film of a liquid crystal display device.

In recent years, an optically anisotropic film exhibiting reverse wavelength dispersibility has been studied (JP2008-273925A). In addition, the reverse wavelength dispersibility means "negative dispersion" characteristics showing an increase in a birefringence in accordance with an increase in a measurement wavelength in at least a part of a wavelength range in the visible region.

SUMMARY OF THE INVENTION

On the other hand, a reverse wavelength dispersibility exhibited by optically anisotropic films in the related art has not necessarily been sufficient, and accordingly, a further improvement has been required.

More specifically, in a case of taking an example in which a λ/4 plate (¼ wavelength plate) is used as an optically anisotropic film, it is ideal that a phase difference in the visible region is a ¼ wavelength of a measurement wavelength. However, in optically anisotropic films in the related art, there is a tendency that a deviation from an ideal curve appears on a long wavelength side in the visible region. Furthermore, in the present specification, the optical characteristics which are closer to the ideal curve are meant to indicate that the reverse wavelength dispersibility is excellent.

Taking the circumstances into consideration, the present invention has an object to provide a composition that makes it possible to form an optically anisotropic film exhibiting excellent reverse wavelength dispersibility.

In addition, the present invention has another object to provide an optically anisotropic film, a circularly polarizing plate, a display device, and a near-infrared absorbing coloring agent.

The present inventors have conducted intensive studies on problems in the related art, and as a result, they have found that the objects can be accomplished by the following configurations.

(1) A composition comprising:
a liquid crystal compound or a polymer; and
a near-infrared absorbing coloring agent having a structural moiety consisting of a coloring agent skeleton and a mesogenic group that is bonded to the coloring agent skeleton,
in which the near-infrared absorbing coloring agent satisfies Conditions 1 and 2 which will be described later.

(2) The composition as described in (1),
in which in a case where a light absorption coefficient of the near-infrared absorbing coloring agent at a wavelength of 650 nm is defined as $\varepsilon(650)$ and a light absorption coefficient at an absorption maximum wavelength is defined as $\varepsilon(\lambda max)$, $\varepsilon(650)/\varepsilon(\lambda max)$ is 0.200 or less.

(3) The composition as described in (1) or (2),
in which the near-infrared absorbing coloring agent is a compound represented by Formula (1) which will be described later.

(4) The composition as described in (3),
in which Z's each independently represent a group selected from the group consisting of a single bond, —CH$_2$CH$_2$—, —CH$_2$O—, —CH$_2$NR—, —CH=CH—, —CH=N—, —N=N—, —C≡C—, —COO—, —CONR—, —COOCH$_2$CH$_2$—, —CONRCH$_2$CH$_2$—, —OCOCH=CH—, and —C≡C—C≡C—,
R represents a hydrogen atom or an alkyl group having 1 to 6 carbon atoms, and
at least one or more of hydrogen atoms in Z may be substituted with fluorine atoms.

(5) The composition as described in (3) or (4),
in which at least one of the substituents has a polymerizable group.

(6) The composition as described in any one of (3) to (5),
in which the near-infrared absorbing coloring agent is a compound represented by Formula (3) which will be described later.

(7) The composition as described in any one of (1) to (6),
in which the liquid crystal compound is a reverse wavelength dispersion liquid crystal compound.

(8) An optically anisotropic film formed of the composition as described in any one of (1) to (7).

(9) A circularly polarizing plate comprising:
the optically anisotropic film as described in (8); and
a polarizer.

(10) A display device comprising:
a display element; and
the circularly polarizing plate as described in (9), arranged on the display element.

(11) A near-infrared absorbing coloring agent comprising a structural moiety consisting of a coloring agent skeleton and a mesogenic group that is bonded to the coloring agent skeleton,
in which the near-infrared absorbing coloring agent satisfies Conditions 1 and 2 which will be described later.

According to the present invention, it is possible to provide a composition that makes it possible to form an optically anisotropic film exhibiting excellent reverse wavelength dispersibility.

In addition, according to the present invention, it is possible to provide an optically anisotropic film, a circularly polarizing plate, a display device, and a near-infrared absorbing coloring agent.

DESCRIPTION OF THE PREFERRED EMBODIMENTS

Figure 1:
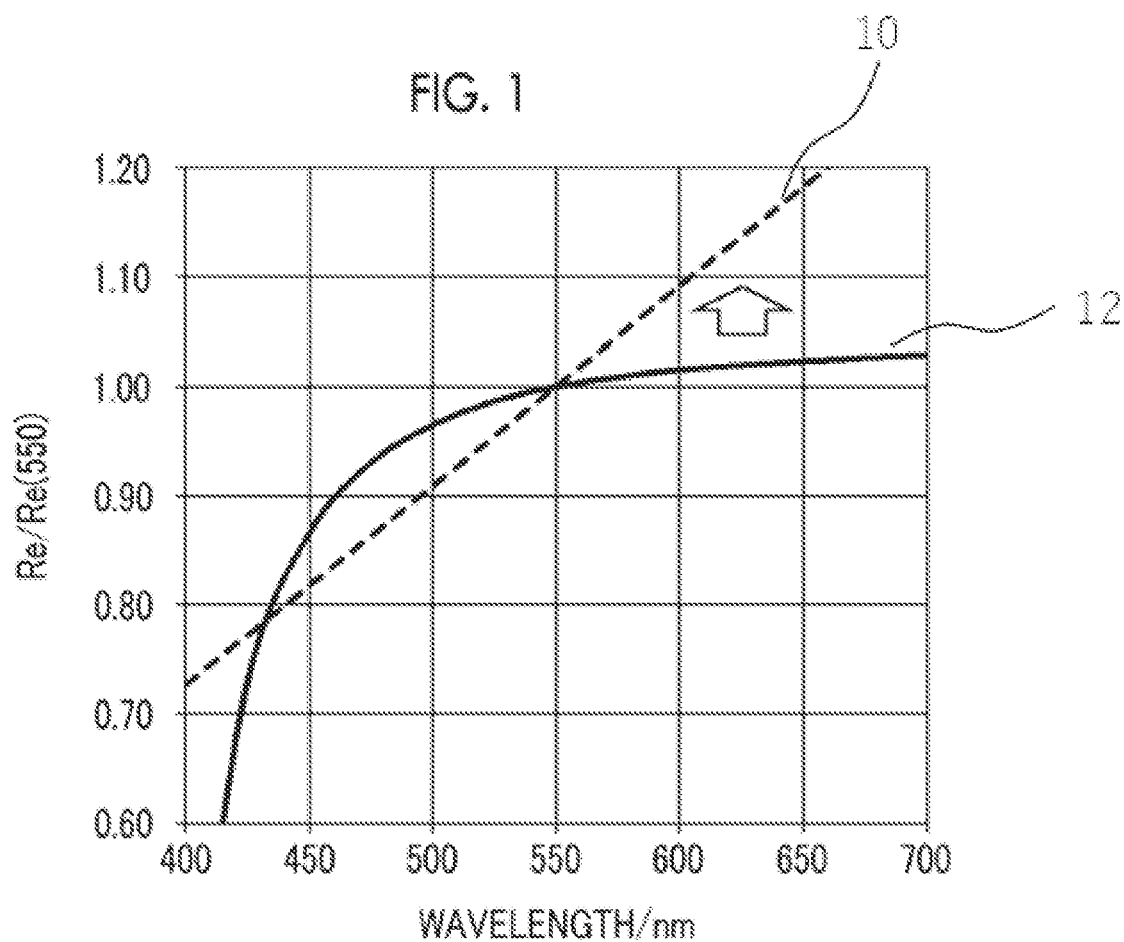
FIG. 1 is a view showing a comparison between the wavelength dispersion of an optically anisotropic film exhibiting reverse wavelength dispersibility in the related art and the wavelength dispersion of an ideal birefringence Δn.

Hereinafter, the present invention will be described in detail. Furthermore, in the present specification, a numerical range expressed using "to" means a range that includes the preceding and succeeding numerical values of "to" as the lower limit value and the upper limit value, respectively. First, terms used in the present specification will be described. In addition, a fast axis and a slow axis are each defined at 550 nm unless otherwise specified.

In the present invention, $Re(\lambda)$ and $Rth(\lambda)$ represent an in-plane retardation and a thickness-direction retardation at a wavelength of λ, respectively. The wavelength of λ refers to 550 nm unless otherwise specified.

In the present invention, $Re(\lambda)$ and $Rth(\lambda)$ are values measured at a wavelength of λ in AxoScan OPMF-1 (manufactured by Opto Science, Inc.). By inputting an average refractive index ((nx+ny+n)/3) and a film thickness (d (μm)) to AxoScan, the values can be calculated:

Slow axis direction (°)

$Re(\lambda)=R0(\lambda)$ $Rth(\lambda)=((nx+ny)/2-nz) \times d.$

Furthermore, $R0(\lambda)$ is expressed in a numerical value calculated with AxoScan OPMF-1, but means $Re(\lambda)$.

In the present specification, the refractive indices, nx, ny, and nz are measured with an Abbe refractometer (NAR-4T, manufactured by Atago Co., Ltd.), using a sodium lamp (λ=589 nm) as a light source. In addition, in a case where a wavelength dependency is measured, the wavelength dependency can be measured with a multi-wavelength Abbe refractometer DR-M2 (manufactured by Atago Co., Ltd.) in combination with an interference filter.

Moreover, the values mentioned in Polymer Handbook (JOHN WILEY & SONS, INC.) and the catalogues of various optical films can be used. The values of the average refractive indices of major optical films are exemplified below: cellulose acylate (1.48), cycloolefin polymer (1.52), polycarbonate (1.59), polymethyl methacrylate (1.49), and polystyrene (1.59).

Moreover, in the present specification, "visible rays" are intended to mean a light at a wavelength of 400 nm or more and less than 700 nm. Further, "near-infrared rays" are intended to mean a light at a wavelength from 700 nm to 2,000 nm. In addition, "ultraviolet rays" are intended to mean a light at a wavelength of 10 nm or more and less than 400 nm.

In addition, in the present specification, angles (for example, an angle of "90°") and a relationship thereof (for example, "perpendicular" and "parallel") include a range of errors tolerable in the technical field to which the present invention belongs. For example, the angle means an angle in a range of less than ±10° of a rigorous angle, and the error from the rigorous angle is preferably 5° or less, and more preferably 3° or less.

The bonding direction of a divalent group (for example, —O—CO—) as noted in the present specification is not particularly limited, and for example, in a case where $D^1$ in Formula (1) which will be described later is —O—CO—, and *1 and *2 represent a bonding position to the Ar side and a bonding position to the $G^1$ side, respectively, $D^1$ may be either *1-O—CO-*2 or *1-CO—O-*2.

One of feature points of the composition of the embodiment of the present invention may be that a near-infrared absorbing coloring agent exhibiting predetermined features is used.

Hereinafter, features of the present invention will be described in detail.

First, FIG. 1 shows the wavelength dispersion characteristics of a phase difference $(Re(\lambda))$ at each wavelength in the visible region with a phase difference $(Re(550 \text{ nm}))$ at a measurement wavelength of 550 nm being normalized as 1. For example, the above-mentioned ideal λ/4 plate has "negative dispersion" characteristics in that a phase difference increases as a measurement wavelength increases since the phase difference is in a relationship in proportional with the measurement wavelength as indicated by a dotted line 10 in FIG. 1. In contrast, with regard to an optically anisotropic film exhibiting reverse wavelength dispersibility in the related art, the wavelength dispersion characteristics are at positions overlapping an ideal curve indicated by a dotted line in the short wavelength range but show a tendency to deviate from the ideal curve in the long wavelength range, as indicated by a solid line 12 in FIG. 1.

In an optically anisotropic film obtained using the composition of an embodiment of the present invention, the optical characteristics in the long wavelength range can be brought close to an ideal curve as indicated by a white arrow by using a predetermined near-infrared absorbing coloring agent.

Figure 2:
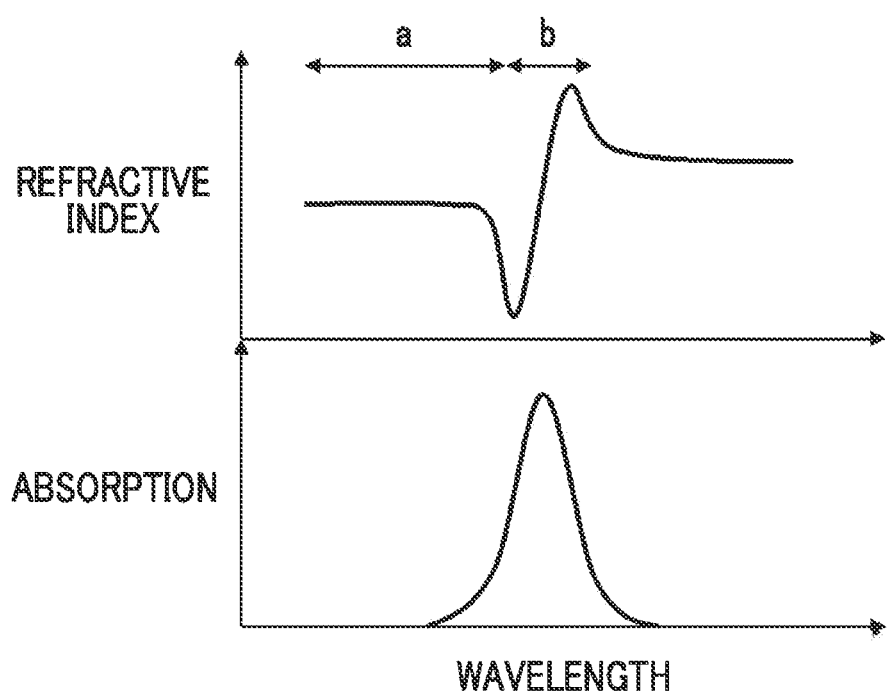
FIG. 2 is a view showing the wavelength dispersion characteristics with respect to a refractive index and an absorption coefficient of an organic molecule.

As a reason why the characteristics are obtained, the refractive index wavelength dispersion characteristics of general organic molecules will firstly be described with reference to FIG. 2. In FIG. 2, the upper side shows the behavior of a refractive index with respect to a wavelength, and the lower side shows the behavior (absorption spectrum) of absorption characteristics with respect to the wavelength.

For the organic molecule, a refractive index n in a region (a region a in FIG. 2) away from the intrinsic absorption wavelength decreases monotonically as the wavelength increases. Such the dispersion is referred to as "normal dispersion". In contrast, a refractive index n in a wavelength band including an intrinsic absorption (a region b in FIG. 2) rapidly increases as the wavelength increases. Such the dispersion is referred to as "anomalous dispersion".

That is, as shown in FIG. 2, an increase or a decrease in the refractive index is observed immediately before the wavelength range having the absorptions therein.

The near-infrared absorbing coloring agent used in the composition of the embodiment of the present invention satisfies Conditions 1 and 2 which will be described later. As will be described later in detail, Condition 1 represents the shape of a predetermined structural moiety of the near-infrared absorbing coloring agent, and indicates that as the value of λ2/λ1 in Condition 1 is smaller, the near-infrared absorbing coloring agent is more anisotropic. More specifically, as the value of λ2/λ1 in Condition 1 is smaller, the near-infrared absorbing coloring agent has a rodlike structure extending in one direction, which corresponds to a so-called high-aspect ratio molecule. In addition, Condition 2 is related to the direction of a transition moment, and by satisfying the requirement of Condition 2, the direction of the transition moment of absorption of the near-infrared absorbing coloring agent is more perpendicular to the long axis of the near-infrared absorbing coloring agent.

In a case where an optically anisotropic film is formed using a composition including the near-infrared absorbing coloring agent as described above, and a liquid crystal compound or polymer, the near-infrared absorbing coloring agent is easily arranged so that the slow axis of the optically anisotropic film and the long axis direction of the near-infrared absorbing coloring agent (the first eigenvector of the first eigenvalue which will be described later) are in parallel, and as a result, the near-infrared absorbing coloring agent is arranged so that the direction of the transition moment of absorption of the near-infrared absorbing coloring agent is closer to the fast axis of the optically anisotropic film. In a case where such an arrangement of the near-infrared absorbing coloring agent is accomplished, the ordinary ray refractive index is further lowered as compared with the optically anisotropic film including no near-infrared absorbing coloring agent in such an arrangement.

Figure 3:
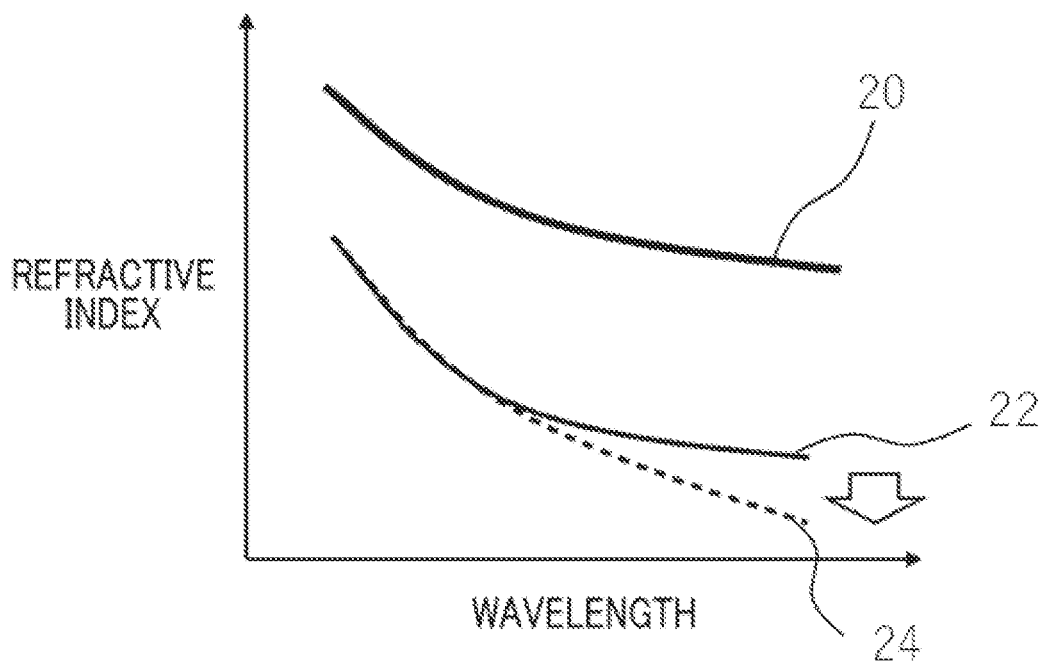
FIG. 3 is a view showing a comparison of the wavelength dispersion between an extraordinary ray refractive index ne and an ordinary ray refractive index no depending on the presence or absence of predetermined absorption characteristics.

Specifically, FIG. 3 is a view showing a comparison of the wavelength dispersion between an extraordinary ray refractive index ne and an ordinary ray refractive index no depending on the presence or absence of the near-infrared absorbing coloring agent in the arrangement. In FIG. 3, the thick line 20 indicates a curve of the extraordinary ray refractive index ne in a case where there is no near-infrared absorbing coloring agent in the arrangement, and the solid line 22 indicates a curve of the ordinary ray refractive index no in a case where there is no near-infrared absorbing coloring agent in the arrangement. In contrast, in the optically anisotropic film having the near-infrared absorbing coloring agent in the arrangement, a value of the ordinary ray refractive index no in the long wavelength range in the visible region is further lowered as indicated by a broken line 24 under the influence derived from an absorption at a near-infrared ray wavelength as shown in FIG. 2. As a result, a birefringence Δn which is a difference between the extraordinary ray refractive index ne and the ordinary ray refractive index no is larger in the long wavelength range in the visible region, and thus, the behavior indicated by the arrow shown in FIG. 1 is accomplished.

Next, the materials included in the composition of the embodiment of the present invention will be described in detail.

Near-Infrared Absorbing Coloring Agent

The composition of the embodiment of the present invention includes a near-infrared absorbing coloring agent (hereinafter also referred to as a "specific coloring agent") including a structural moiety consisting of a coloring agent skeleton and a mesogenic group that is bonded to the coloring agent skeleton. The specific coloring agent satisfies the following Conditions 1 and 2.

Condition 1: Coordinate data of atoms in the structural moiety in a most stable molecular structure of the structural moiety of the specific coloring agent are acquired by computation using a density functional theory, the obtained coordinate data are subjected to main component analysis to determine eigenvalues, and in a case where a first eigenvalue, a second eigenvalue, and a third eigenvalue are set in descending order among the eigenvalues, an absolute value $\lambda_1$ of a square root of the first eigenvalue and an absolute value $\lambda_2$ of a square root of the second eigenvalue satisfy a relationship of Formula (A).

$$\lambda_2/\lambda_1 \leq 0.60 \qquad \text{Formula (A)}$$

Condition 2: An angle between a direction of a transition moment of absorption of the near-infrared absorbing coloring agent and a direction of an eigenvector of the first eigenvalue is 75.0° or more.

First, Conditions 1 and 2 will be described in detail below.

In Condition 1, first, the most stable molecular structure of the structural moiety of the specific coloring agent is determined by computation using a density functional theory.

The most stable molecular structure obtained by computation using a density functional theory is determined by optimization using Gaussian 16 (Gaussian 16, Revision B. 01, M. J. Frisch, G. W. Trucks, H. B. Schlegel, G. E. Scuseria, M. A. Robb, J. R. Cheeseman, G. Scalmani, V. Barone, G. A. Petersson, H. Nakatsuji, X. Li, M. Caricato, A. V. Marenich, J. Bloino, B. G. Janesko, R. Gomperts, B. Mennucci, H. P. Hratchian, J. V. Ortiz, A. F. Izmaylov, J. L. Sonnenberg, D. Williams-Young, F. Ding, F. Lipparini, F. Egidi, J. Goings, B. Peng, A. Petrone, T. Henderson, D. Ranasinghe, V. G. Zakrzewski, J. Gao, N. Rega, G. Zheng, W. Liang, M. Hada, M. Ehara, K. Toyota, R. Fukuda, J. Hasegawa, M. Ishida, T. Nakajima, Y. Honda, O. Kitao, H. Nakai, T. Vreven, K. Throssell, J. A. Montgomery, Jr., J. E. Peralta, E. Ogliaro, M. J. Bearpark, J. J. Heyd, E. N. Brothers, K. N. Kadin, V. N. Staroverov, T. A. Keith, R. Kobayashi, J. Normand, K. Raghavachari, A. P. Rendell, J. C. Burnt, S. S. Iyengar, J. Tomasi, M. Cossi, J. M. Millam, M. Klene, C. Adamo, R. Cammi, J W. Ochterski, R. L. Martin, K. Morokuma, O. Farkas, J. B. Foresman, and D. J. Fox, Gaussian, Inc., Wallingford CT, 2016.) manufactured by Gaussian, Inc., and using B3LYP as a functional of a density functional, 6-31G (d) as a base function, and default values of Gaussian 16 as other parameters.

Furthermore, the structural moiety of the specific coloring agent means a moiety consisting of a coloring agent skeleton and a mesogenic group bonded to the coloring agent skeleton in the specific coloring agent, and it does not include another group (for example, a substituent that is a non-mesogenic group, linked to a mesogenic group) that is bonded to the mesogenic group in the specific coloring agent. In a case of performing the computation, such another group (non-mesogenic group) that is bonded to the mesogenic group is substituted with a hydrogen atom so as to perform the computation.

The coordinate data of each atom in the structural moiety of the specific coloring agent in the most stable molecular structure obtained by the computation are acquired. Specifically, a center of gravity of each atom in the structural moiety of the specific coloring agent in the most stable molecular structure thus obtained is determined, and the coordinate $(x_i, y_i, z_i)$ of x, y, and z of each atom is determined using the center as a reference, and three-dimensional coordinate data regarding the arrangement of the atom in the structural moiety of the specific coloring agent are acquired.

Next, the obtained coordinate data are subjected to main component analysis to obtain eigenvalues. More specifically, a main component axis and eigenvalues there are determined by performing main component analysis with a variance-covariance matrix which will be described later, obtained from the coordinate data. That is, the eigenvalues of the variance-covariance matrix, which will be described later, obtained from the coordinate data are determined.

The main component analysis is a method for sequentially obtaining directions in which a degree of data spread is large in an n-dimensional space in a case where each of the N pieces of data is an n-component vector in the n-dimensional space. In a case where a molecule is targeted as in the present invention, it is in a three-dimensional space of xyz, and therefore, n is 3 and N is the number of atoms included in the molecule.

Figure 4:
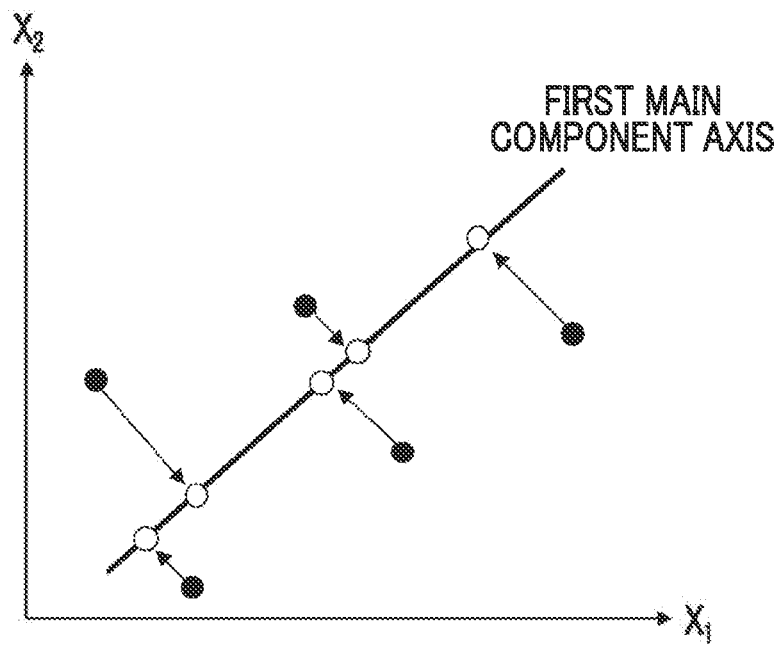
FIG. 4 is a view illustrating main component analysis.
Figure 5:
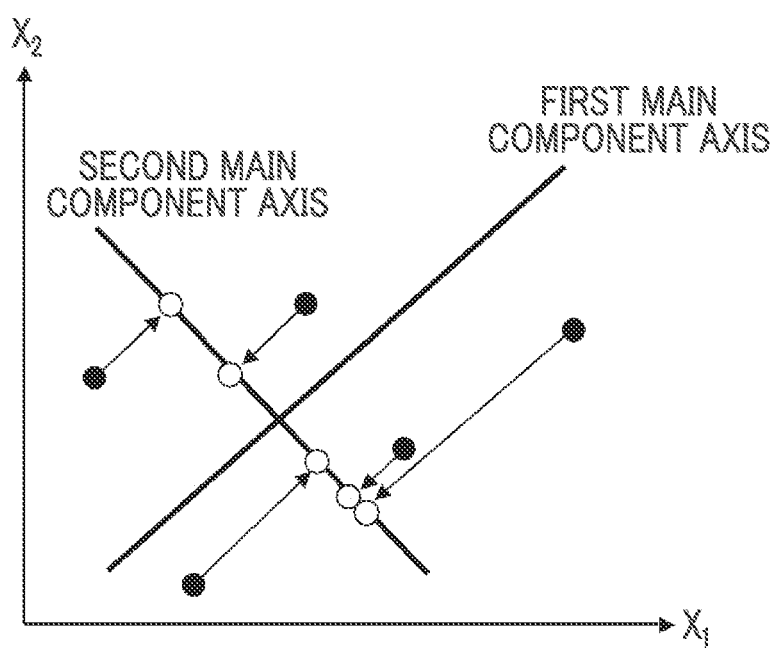
FIG. 5 is a view illustrating main component analysis.

Next, the main component analysis will be described with reference to FIGS. 4 and 5. In FIGS. 4 and 5, the atoms constituting the molecule are illustrated in the coordinate space. It should be noted that the atoms are actually located in the three-dimensional space as described above, but the third axis is omitted in FIGS. 4 and 5 for the sake of simplicity of the description. Further, the dots represented by the black circles in FIGS. 4 and 5 correspond to the positions of the atoms.

Next, a case where the x-axis of FIG. 4 is rotated is considered. A dot where the data are projected from a dot indicated by the black circle to the x-axis after rotation, that is, an intersection indicated by the white dot between a line drawn vertically from the dot represented by the black circle and an axis thereof is defined as a main component score on the axis on the coordinate data. A first purpose of the main component analysis is to obtain the first main component axis which is a direction in which the spread of data is most widespread (that is, to find an axis in which a variance of the projected data is maximized), and the direction of the x-axis after rotation, in which a variance of the main component scores is maximized, corresponds to a first main component axis.

In the main component analysis, subsequently, a second main component axis, which is the next spreading direction, is searched according to the same procedure as above. The second main component axis is searched in a two-dimensional space perpendicular to the first main component axis. Further, since FIG. 5 is drawn two-dimensionally, a space perpendicular to the first main component axis is one-dimensional and the second main component axis is automatically determined.

Furthermore, since coordinates of molecules are actually data in a three-dimensional space, the coordinate axis is rotated even in the two-dimensional space to obtain the second main component axis from the direction in which a variance of the main component scores on that axis is maximized. In a case of the data in three-dimensional space, the third main component axis is automatically determined as an axis perpendicular to the first main component axis and the second main component axis.

In the present invention, the expansion of the structural moiety of the specific coloring agent is required by performing the main component analysis, and in particular, the first main component corresponds to so-called information on the long axis of the structural moiety of the specific coloring agent, and the second main component corresponds to so-called information of an axis perpendicular to the long axis of the structural moiety of the specific coloring agent. Therefore, $\lambda 2/\lambda 1$ which will be described later corresponds to a parameter indicating the anisotropy of the structural moiety of the specific coloring agent, meaning that the smaller this value, longer one direction of the structural moiety of the specific coloring agent.

As a specific procedure of the main component analysis in the present invention, a variance-covariance matrix $\sigma$ represented by the following formula is obtained, based on the obtained coordinate data, and the obtained variance-covariance matrix $\sigma$ is diagonalized to obtain three eigenvalues and three eigenvectors. The largest one of the three eigenvalues is taken as a first eigenvalue, the next largest one is taken as a second eigenvalue, the smallest one is taken as a third eigenvalue, the vector corresponding to the first eigenvalue is taken as a first eigenvector, the vector corresponding to a second eigenvalue is taken as a second eigenvector, and the vector corresponding to the third eigenvalue is taken as a third eigenvector.

$$\sigma = \frac{1}{N}\begin{pmatrix} \Sigma x_i^2 & \Sigma x_i y_i & \Sigma x_i z_i \\ \Sigma x_i y_i & \Sigma y_i^2 & \Sigma z_i y_i \\ \Sigma x_i z_i & \Sigma z_i y_i & \Sigma z_i^2 \end{pmatrix}.$$

In the formula, N represents the number of atoms included in the structural moiety, i is an index specifying each atom, which has a value from 1 to N, and $x_i$, $y_i$, and $z_i$ each represent a coordinate of each atom, with a center of gravity being set to an origin.

In Condition 1, the absolute value $\lambda 1$ of a square root of the first eigenvalue and the absolute value $\lambda 2$ of a square root of the second eigenvalue are determined, and these satisfy a relationship of Formula (A).

$$\lambda 2/\lambda 1 \leq 0.60 \quad \text{Formula (A)}$$

Above all, $\lambda 2/\lambda 1$ is preferably 0.50 or less, and more preferably 0.40 or less from the viewpoint that the effect of the present invention is more excellent. The lower limit of $\lambda 2/\lambda 1$ is not particularly limited, but is often 0.20 or more.

Condition 2 specifies that an angle formed between the direction of the transition moment of absorption of the infrared absorbing coloring agent and the direction of the eigenvector of the first eigenvalue is 75.0° or more.

First, the maximum absorption wavelength of the infrared absorbing coloring agent is determined using Gaussian 16 Revision B.01, and using B3LYP as a functional, 6-31G (d) as a base function, and default values of Gaussian 16 as the other parameters by a time-dependent density functional theory.

The direction of the transition moment of absorption of the infrared absorbing coloring agent is determined by a transition dipole moment vector M corresponding to the maximum absorption wavelength obtained by the procedure. Specifically, the transition dipole moment can be obtained using Gaussian 16 Revision B.01, and using B3LYP as a functional and 6-31G (d) as a base function by a time-dependent density functional theory for the above-mentioned most stable structure.

An angle formed between the direction of the obtained transition moment and the first eigenvector of the first eigenvalue obtained by the above-mentioned procedure is calculated. Specifically, the angle formed above is computed using a transition dipole moment vector M obtained from Gaussian 16 and a first eigenvector e. θ is obtained using the following relationship between an angle θ between the vectors, and an inner product between the vectors:

$$\cos(\theta) = e \cdot M/(|e||M|).$$

Here, $|e|$ and $|M|$ mean a length of each vector.

The angle formed between the direction of the transition moment and the first eigenvector is preferably 80.0° or more, and more preferably 85.0° or more from the viewpoint that the effect of the present invention is more excellent. An upper limit thereof is not particularly limited, but is often 90.0° or less.

The specific coloring agent has at least one maximum absorption wavelength (λmax) in the near-infrared region. Above all, the maximum absorption wavelength preferably lies between 700 and 2,000 nm, more preferably lies between 700 and 1,200 nm, and still more preferably lies between 700 and 900 nm from the viewpoint that the effect of the present invention is more excellent.

Furthermore, examples of a method for measuring the maximum absorption wavelength of the specific coloring agent include a method in which a sample obtained by dissolving the specific coloring agent in chloroform at about 5 to 10 μmol/L is placed in a quartz cell and a maximum absorption wavelength thereof is measured with a spectrophotometer UV-3100PC manufactured by Shimadzu Corporation.

Moreover, it is preferable that the specific coloring agent has as little absorption as possible in the visible region from the viewpoint of imparting invisibility. Specifically, in a case where the light absorption coefficient at 650 nm is defined as ε(650) and the light absorption coefficient at the maximum absorption wavelength is ε(λmax), ε(650)/ε(λmax) which is a ratio of ε(650) to ε(λmax) is preferably 0.200 or less, more preferably 0.100 or less, and still more preferably 0.050 or less. A lower limit thereof is not particularly limited, but is often 0.001 or more.

The ε(650) and ε(λmax) of the specific coloring agent are calculated from a spectrum obtained by the method described in the method for measuring a maximum absorption wavelength of the specific coloring agent.

The type of the specific coloring agent is not particularly limited as long as it has a structural moiety consisting of a coloring agent skeleton and a mesogenic group which is bonded to the coloring agent skeleton and satisfies Conditions 1 and 2, but examples thereof include pyrrolopyrrole-based coloring agents, polymethine-based coloring agents (for example, cyanine, oxonol, merocyanine, squarylium, and croconium), cyclic π-based coloring agents (for example, phthalocyanine, naphthalocyanine, and porphyrin), rylene-based coloring agents (for example, quaterrylene and pentarylene), metal complex-based coloring agents (for example, a nickel dithiol complex), cationic coloring agents (for example, triarylmethane, aminium, pyrylium, and diimmmonium), and azine-based coloring agents (for example, clydine, oxazine, thiazine, diazine, dioxazine, and dioxathiazine).

The mesogenic group is a functional group which is rigid and has alignment. Examples of a structure of the mesogenic group include a structure formed by linking a plurality of groups selected from the group consisting of an aromatic ring group (an aromatic hydrocarbon ring group and an aromatic heterocyclic group) and an alicyclic group directly or via a linking group (for example, groups exemplified as a divalent group represented by Z which will be described later.).

As the specific coloring agent, a compound represented by Formula (1) is preferable from the viewpoint that the effect of the present invention is more excellent.

$(W-X)_p-D$     Formula (1)

In the formula, D represents a coloring agent skeleton. The coloring agent skeleton is a main skeleton portion which mainly contributes to the absorption of near-infrared rays in the specific coloring agent.

The type of the coloring agent skeleton is not particularly limited, but examples thereof include pyrrolopyrrole-based coloring agent skeletons, polymethine-based coloring agent skeletons, cyclic π-based coloring agent skeletons, rylene-based coloring agent skeletons, metal complex-based coloring agent skeletons, cationic coloring agent skeletons, and azine-based coloring agent skeletons. Specific examples of each coloring agent skeleton include the skeletons in the specific examples described in the above-mentioned examples of the type of the specific coloring agent.

Furthermore, examples of the coloring agent skeleton include structures (groups) obtained by removing any p pieces of hydrogen atoms from a coloring agent.

W represents a hydrogen atom or a substituent.

Examples of the substituent include an alkyl group, an alkenyl group, an alkynyl group, an aryl group, an amino group, an alkoxy group, an aryloxy group, an aromatic heterocyclic oxy group, an acyl group, an alkoxycarbonyl group, an aryloxycarbonyl group, an acyloxy group, an acylamino group, an alkoxycarbonylamino group, an aryloxycarbonylamino group, a sulfonylamino group, a sulfamoyl group, a carbamoyl group, an alkylthio group, an arylthio group, an aromatic heterocyclic thio group, a sulfonyl group, a sulfinyl group, a ureide group, a phosphoric acid amide group, a hydroxy group, a mercapto group, a halogen atom, a cyano group, a sulfo group, a carboxyl group, a nitro group, a hydroxamic acid group, a sulfino group, a hydrazino group, an imino group, a heterocyclic group (for example, a heteroaryl group), a silyl group, and a group formed by combination of these groups. Further, the substituent may further be substituted with a substituent.

Among those, a group having a polymerizable group can be mentioned as a substituent from the viewpoint that the effect of the present invention is more excellent. The polymerizable group has the same definition as the polymerizable group that may be contained in a liquid crystal compound which will be described later.

Examples of the group having a polymerizable group include a group represented by Formula (5). In Formula (5), * represents a bonding position.

*-L-P     Formula (5)

Examples of L include a single bond or a divalent linking group. Examples of the divalent linking group include a divalent hydrocarbon group (for example, a divalent aliphatic hydrocarbon group such as an alkylene group having 1 to 10 carbon atoms, an alkenylene group having 1 to 10 carbon atoms, and an alkynylene group having 1 to 10 carbon atoms, and a divalent aromatic hydrocarbon group such as an arylene group), a divalent heterocyclic group, —O—, —S—, —NH—, —N(Q)-, —CO—, or a group formed by combination of these groups (for example, —O-divalent hydrocarbon group-, —(O-divalent hydrocarbon group)$_m$-O— (in represents an integer of 1 or more), and -divalent hydrocarbon group-O—CO—). Q represents a hydrogen atom or an alkyl group.

P represents a polymerizable group.

X represents a mesogenic group represented by Formula (2).

$-(A-Z)_n-A-$     Formula (2)

A's each independently represent a divalent aromatic ring group which may have a substituent or a divalent non-aromatic ring group which may have a substituent.

Furthermore, in Formula (1), Formula (2) is preferably arranged as follows.

$(W-(A-Z)_n-A)_p-D$     Formula (1)

Examples of the divalent aromatic ring group include a divalent aromatic hydrocarbon ring group and a divalent aromatic heterocyclic group, and the divalent aromatic hydrocarbon ring group is preferable. Examples of the divalent aromatic hydrocarbon ring group include a phenylene group and a naphthylene group.

Examples of the divalent non-aromatic ring group include a divalent non-aromatic hydrocarbon ring group (alicyclic group) and a divalent non-aromatic heterocyclic group, and the divalent non-aromatic hydrocarbon ring group (for example, a cycloalkylene group having 5 to 7 carbon atoms) is preferable.

Examples of the substituent which may be contained in the divalent aromatic ring group and the divalent non-aromatic ring group include the examples of the substituent exemplified as W mentioned above.

Z represents a single bond or a divalent linking group.

The divalent linking group represents, for example, a group selected from the group consisting of —CH$_2$CH$_2$—, —CH$_2$O—, —CH$_2$NR—, —CH=CH—, —CH=N—, —N=N—, —C≡C—, —COO—, —CONR—, —COOCH$_2$CH$_2$—, —CONRCH$_2$CH$_2$—, —OCOCH=CH—, and —C≡C—C≡C—.

R represents a hydrogen atom or an alkyl group having 1 to 6 carbon atoms.

In addition, at least one or more hydrogen atoms in Z may be substituted with fluorine atoms.

n represents an integer of 1 to 10. Among these, n is preferably an integer of 2 to 6, and more preferably an integer of 3 to 5 from the viewpoint that the effect of the present invention is more excellent.

p represents an integer of 2 or more. Among these, p is preferably 2 from the viewpoint that the effect of the present invention is more excellent.

Furthermore, at least one of W's represents a substituent.

As the specific coloring agent, a compound represented by Formula (3) is preferable from the viewpoint that the effect of the present invention is more excellent.

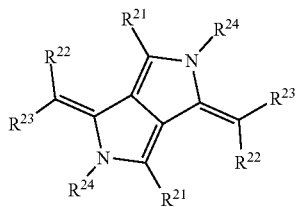

Formula (3)

In the formula, $R^{21}$'s each independently represent a group represented by Formula (4).

Formula (4)

W represents a hydrogen atom or a substituent, W has the same definition as mentioned above.

X represents the above-mentioned mesogenic group represented by Formula (2). The mesogenic group represented by Formula (2) has the same definition as mentioned above.

Furthermore, at least one of W's represents a substituent.

$R^{22}$ and $R^{23}$ each independently represent a hydrogen atom or a substituent, and at least one of $R^{22}$ or $R^{23}$ represents an electron-withdrawing group. Further, $R^{22}$ and $R^{23}$ may be bonded to each other to form a ring.

Examples of the substituent represented by each of $R^{22}$ and $R^{23}$ include the examples of the substituent exemplified as W mentioned above. Further, as the substituent represented by each of $R^{22}$ and $R^{23}$, a group other than the group having a mesogenic group is preferable.

The electron-withdrawing group represents a substituent whose a Hammett's sigma para value (σp value) is positive, and examples thereof include a cyano group, an acyl group, an alkyloxycarbanyl group, an aryloxycarbonyl group, a sulfamoyl group, a sulfinyl group, and a heterocyclic group.

These electron-withdrawing groups may further be substituted.

The Hammett's substituent constant σ value will be described. The Hammett rule is an empirical rule proposed by L. P. Hammett in 1935 in order to quantitatively discuss an influence of a substituent exerted on a reaction or equilibrium of a benzene derivative, and nowadays, its validity has been widely recognized. The substituent constants required for the Hammett rule include a σp value and a σm value, and these values are described in many general scientific articles. These are specifically described in, for example, "Lange's Handbook of Chemistry" edited by J. A. Dean, 12$^{th}$ edition, 1979 (McGraw-Hill), "Region of Chemistry", extra edition, No. 122, pp. 96 to 103, 1979 (Nankodo Co., Ltd.), Chem. Rev., 1991, Vol. 91, pp. 165 to 195, and the like. As the electron-withdrawing group in the embodiment of the present invention, a substituent having a Hammett's substituent constant σp value of 0.20 or more is preferable. The σp value is preferably 0.25 or more, more preferably 0.30 or more, and still more preferably 0.35 or more. An upper limit thereof is not particularly limited, but is preferably 0.80 or less.

Specific examples thereof include a cyano group (0.66), a carboxyl group (—COOH: 0.45), an alkoxycarbonyl group (—COOMe: 0.45), an aryloxycarbonyl group (—COOPh: 0.44), a carbamoyl group (—CONH$_2$: 0.36), an alkylcarbonyl group (—COMe: 0.50), an arylcarbonyl group (—COPh: 0.43), an alkylsulfonyl group (—SO$_2$Me: 0.72), and an arylsulfonyl group (—SO$_2$Ph: 0.68).

In the present specification, Me represents a methyl group and Ph represents a phenyl group. Further, the values in parentheses are σp values of the representative substituents as extracted from Chem. Rev., 1991, Vol. 91, pp. 165 to 195.

In a case where $R^{22}$ and $R^{23}$ are bonded to form a ring, they form a 5- to 7-membered ring (preferably a 5- or 6-membered ring), and it is typically preferable to use a ring thus formed as an acidic nucleus in a merocyanine coloring agent.

As the ring formed by the bonding of $R^{22}$ and $R^{23}$, a 1,3-dicarbonyl nucleus, a pyrazolinone nucleus, a 2,4,6-triketohexahydropyrimidine nucleus (including a thioketone form), a 2-thio-2,4-thiazolidinedione nucleus, a 2-thio-2,4-oxazolidinedione nucleus, a 2-thio-2,5-thiazolidinedione nucleus, a 2,4-thiazolidinedione nucleus, a 2,4-imidazolidinedione nucleus, a 2-thio-2,4-imidazolidinedione nucleus, a 2-imidazolin-5-one nucleus, a 3,5-pyrazolidinedione nucleus, a benzothiophen-3-one nucleus, or an indanone nucleus is preferable.

$R^{23}$ is preferably a heterocyclic group, and more preferably an aromatic heterocyclic group. The heterocyclic group may be either a monocycle or a polycycle. As the heterocyclic group, a pyrazole ring group, a thiazole ring group, an oxazole ring group, an imidazole ring group, an oxadiazole ring group, a thiadiazole ring group, a triazole ring group, a pyridine ring group, a pyridazine ring group, a pyrimidine ring group, a pyrazine ring group, such the benzo-fused ring group (for example, a benzothiazole ring group and a henzopyrazine ring group) or a naphtho-fused ring group, or a composite of these fused rings is preferable.

The heterocyclic group may be substituted with a substituent. Examples of the substituent include the examples of the substituent exemplified as W mentioned above.

$R^{24}$'s each independently represent a hydrogen atom, an alkyl group, an aromatic hydrocarbon ring group, an aromatic heterocyclic group, a substituted boron (—B(Ra)$_2$, Ra represents a substituent), or a metal atom, and may be covalently bonded or coordinately bonded with $R^{21}$ and/or $R^{23}$.

Examples of the substituent of the substituted boron represented by $R^{24}$ include the examples of the substituent exemplified as W mentioned above, and the alkyl group, the aryl group, or the heteroaryl group is preferable. The substituent of the substituted boron (for example, the above-mentioned alkyl group, aryl group, or heteroaryl group) may further be substituted with a substituent. Examples of the substituent include the examples of the substituent exemplified as W mentioned above.

In addition, the metal atom represented by $R^{24}$ is preferably a transition metal atom, a magnesium atom, an aluminum atom, a calcium atom, a barium atom, a zinc atom, or a tin atom, and more preferably the aluminum atom, the zinc atom, the tin atom, a vanadium atom, an iron atom, a cobalt atom, a nickel atom, a copper atom, a palladium atom, an iridium atom, or a platinum atom.

As the specific coloring agent, a compound represented by Formula (6) is more preferable from the viewpoint that the effect of the present invention is more excellent.

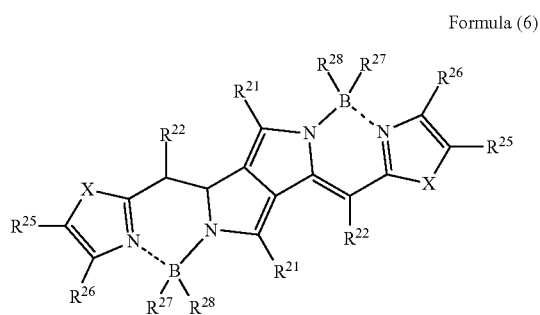

Formula (6)

The definition of $R^{21}$ is the same as mentioned above.

$R^{22}$'s each independently represent a cyano group, an acyl group, an alkoxycarbonyl group, an alkylsulfinyl group, an arylsulfinyl group, or a nitrogen-containing heteroaryl group.

$R^{25}$ and $R^{26}$ each independently represent a hydrogen atom, an alkyl group, an alkoxy group, an aryl group, or a heteroaryl group, and $R^{25}$ and $R^{26}$ may be bonded to each other to form a ring. Examples of the ring thus formed include an alicycle having 5 to 10 carbon atoms, an aromatic hydrocarbon ring having 6 to 10 carbon atoms, and an aromatic heterocyclic ring having 3 to 10 carbon atoms.

The ring formed by the bonding of $R^{25}$ and $R^{26}$ may be substituted with a substituent. Examples of the substituent include the examples of the substituent exemplified as W mentioned above.

$R^{27}$ and $R^{28}$ each independently represent an alkyl group, an alkoxy group, an aryl group, or a heteroaryl group. The group represented by each of $R^{27}$ and $R^{28}$ may further be substituted with a substituent. Examples of the substituent include the examples of the substituent exemplified as W mentioned above.

X's each independently represent an oxygen atom, a sulfur atom, —NR—, —CRR'—, —CH═CH—, or —N═CH—, and R and R' each independently represent a hydrogen atom, an alkyl group, or an aryl group.

The content of the specific coloring agent in the composition is not particularly limited, but from the viewpoint that the effect of the present invention is more excellent, the content is preferably 1% to 50% by mass, and more preferably 2% to 30% by mass with respect to the total mass of the liquid crystal compound.

Liquid Crystal Compound

The type of the liquid crystal compound is not particularly limited, but the liquid crystal compounds can be classified into a rod-shaped type (rod-shaped liquid crystal compound) and a disk-shaped type (disk-shaped liquid crystal compound, a discotic liquid crystal compound) based on the shape. Each of the types can further be classified into a low-molecular type and a high-molecular type. The expression, being high-molecular, generally refers to having a degree of polymerization of 100 or more (Polymer Physics•Phase Transition Dynamics, by Masao Doi, page 2, published by Iwanami Shoten, Publishers, 1992). In addition, two or more kinds of the rod-shaped liquid crystal compounds, two or more kinds of the disk-shaped liquid crystal compounds, or a mixture of the rod-shaped liquid crystal compound and the disk-shaped liquid crystal compound may be used.

The position of the maximum absorption wavelength of the liquid crystal compound is not particularly limited, but from the viewpoint that the effect of the present invention is more excellent, it is preferable that the maximum absorption wavelength is positioned in the ultraviolet region.

The liquid crystal compound is preferably a reverse wavelength dispersion liquid crystal compound. The reverse wavelength dispersion liquid crystal compound means a compound in which an optically anisotropic film formed using the compound exhibits reverse wavelength dispersibility. The expression that the optically anisotropic film exhibits reverse wavelength dispersibility means that the in-plane retardation of the optically anisotropic film increases as a measurement wavelength increases.

From the viewpoint that changes in the temperature and the humidity of the optical characteristics can be suppressed, a liquid crystal compound (hereinafter also referred to as a "polymerizable liquid crystal compound") having a polymerizable group is preferable as the liquid crystal compound. The liquid crystal compounds may be a mixture of two or more kinds thereof, and in this case, it is preferable that at least one has two or more polymerizable groups.

That is, it is preferable that the optically anisotropic film is a layer formed by the fixation of a composition including a polymerizable liquid crystal compound by polymerization or the like, and in this case, it is not necessary to exhibit the liquid crystallinity any longer after forming the layer.

The type of the polymerizable group is not particularly limited, and a polymerizable group which is radically polymerizable or canonically polymerizable is preferable.

A known radically polymerizable group can be used as the radically polymerizable group, and an acryloyl group or a methacryloyl group is preferable.

A known cationically polymerizable group can be used as the cationically polymerizable group, and specific examples thereof include an alicyclic ether group, a cyclic acetal group, a cyclic lactone group, a cyclic thioether group, a spiroorthoester group, and a vinyloxy group. Among those, the alicyclic ether group or the vinyloxy group is preferable, and the epoxy group, the oxetanyl group, or the vinyloxy group is more preferable.

In particular, preferred examples of the polymerizable group include the following groups.

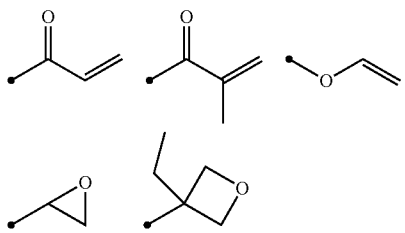

Among those, a compound represented by Formula (I) is preferable as the liquid crystal compound.

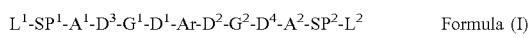

In Formula (I), $D^1$, $D^2$, $D^3$, and $D^4$ each independently represent a single bond, —O—CO—, —C(=S)O—, —$CR^1R^2$—, —$CR^1R^2$—$CR^3R^4$—, —O—$CR^1R^2$—, —$CR^1R^2$—O—$CR^3R^4$—, —CO—O—$CR^1R^2$—, —O—CO—$CR^1R^2$—, —$CR^1R^2$—O—CO—$CR^3R^4$—, —$CR^1R^2$—CO—O—$CR^3R^4$—, —$NR^1$—$CR^2R^3$—, or —CO—$NR^1$—.

$R^1$, $R^2$, $R^3$, and $R^4$ each independently represent a hydrogen atom, a fluorine atom, or an alkyl group having 1 to 4 carbon atoms.

Moreover, in Formula (I), $G^1$ and $G^2$ each independently represent a divalent alicyclic hydrocarbon group having 5 to 8 carbon atoms, and one or more of —$CH_2$—'s constituting the alicyclic hydrocarbon group may be substituted with —O—, —S—, or —NH—.

Furthermore, in Formula (I), $A^1$ and $A^2$ each independently represent a single bond, an aromatic ring having 6 or more carbon atoms, or a cycloalkylene ring having 6 or more carbon atoms.

Moreover, in Formula (I), $SP^1$ and $SP^2$ each independently represent a single bond, a linear or branched alkylene group having 1 to 14 carbon atoms, or a divalent linking group in which one or more of —$CH_2$—'s constituting the linear or branched alkylene group having 1 to 14 carbon atoms are substituted with —O—, —S—, —N(Q)-, or —CO—, and Q represents a polymerizable group.

Incidentally, in Formula (I), $L^1$ and $L^2$ each independently represent a monovalent organic group (for example, an alkyl group or a polymerizable group).

In addition, in a case where Ar is a group represented by Formula (Ar-1), Formula (Ar-2), Formula (Ar-4), or Formula (Ar-5) which will be described later, at least one of $L^1$ or $L^2$ represents a polymerizable group. In addition, in a case where Ar is a group represented by Formula (Ar-3) which will be described later, at least one of $L^1$ or $L^2$, or $L^3$ or $L^4$ in Formula (Ar-3) represents a polymerizable group.

In Formula (1), a 5- or 6-membered ring is preferable as the divalent alicyclic hydrocarbon group having 5 to 8 carbon atoms represented by each of $G^1$ and $G^2$. Further, the alicyclic hydrocarbon group may be either a saturated alicyclic hydrocarbon group or an unsaturated alicyclic hydrocarbon group, but is preferably the saturated alicyclic hydrocarbon group. With respect to the divalent alicyclic hydrocarbon group represented by each of $G^1$ and $G^2$, reference can be made to, for example, the description in paragraph 0078 of JP2012-21068A, the contents of which are incorporated herein by reference.

In Formula (I), examples of the aromatic ring having 6 or more carbon atoms represented by each of $A^1$ and $A^2$ include aromatic hydrocarbon rings such as a benzene ring, a naphthalene ring, an anthracene ring, and a phenanthroline ring; and aromatic heterocyclic rings such as a furan ring, a pyrrole ring, a thiophene ring, a pyridine ring, a thiazole ring, and a benzothiazole ring. Among those, the benzene ring (for example, a 1,4-phenyl group) is preferable.

Furthermore, in Formula (I), examples of the cycloalkylene ring having 6 or more carbon atoms represented by each of $A^1$ and $A^2$ include a cyclohexane ring and a cyclohexene ring, and among these, the cyclohexane ring (for example, a cyclohexane-1,4-diyl group) is preferable.

In Formula (I), as the linear or branched alkylene group having 1 to 14 carbon atoms represented by each of $SP^1$ and $SP^2$, a methylene group, an ethylene group, a propylene group, or a butylene group is preferable.

In Formula (I), the polymerizable group represented by each of $L^1$ and $L^2$ is not particularly limited, but a radically polymerizable group (a group which is radically polymerizable) or a cationically polymerizable group (a group which is cationically polymerizable) is preferable.

A suitable range of the radically polymerizable group is as described above.

On the other hand, in Formula (I), Ar represents any aromatic ring selected from the group consisting of groups represented by Formulae (Ar-1) to (Ar-7). In addition, in Formulae (Ar-1) to (Ar-7), *1 represents a bonding position with $D^1$ and *2 represents a bonding position with $D^2$.

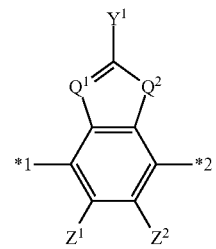

(Ar-1)

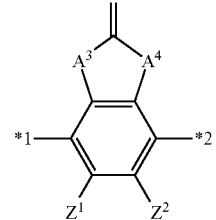

(Ar-2)

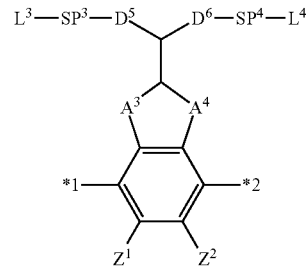

(Ar-3)

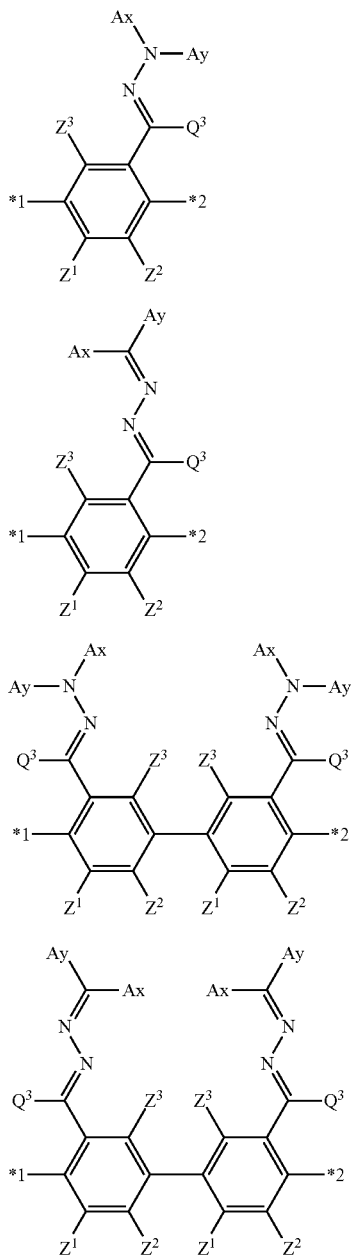

Here, in Formula (Ar-1), $Q^1$ represents N or CH, $Q^2$ represents —S—, —O—, or —N($R^5$)—, $R^5$ represents a hydrogen atom or an alkyl group having 1 to 6 carbon atoms, and $Y^1$ represents an aromatic hydrocarbon ring group having 6 to 12 carbon atoms or an aromatic heterocyclic group having 3 to 12 carbon atoms, each of which may have a substituent.

Examples of the alkyl group having 1 to 6 carbon atoms represented by $R^5$ include a methyl group, an ethyl group, a propyl group, an isopropyl group, an n-butyl group, an isobutyl group, a sec-butyl group, a tert-butyl group, an n-pentyl group, and an n-hexyl group.

Examples of the aromatic hydrocarbon ring group having 6 to 12 carbon atoms represented by $Y^1$ include aryl groups such as a phenyl group, a 2,6-diethylphenyl group, and a naphthyl group.

Examples of the aromatic heterocyclic group having 3 to 12 carbon atoms represented by $Y^1$ include heteroaryl groups such as a thienyl group, a thiazolyl group, a furyl group, a pyridyl group, and a benzofuryl group. Further, examples of the aromatic heterocyclic group further include a group formed by fusion of a benzene ring and an aromatic heterocyclic ring.

In addition, examples of the substituent which may be contained in $Y^1$ include an alkyl group, an alkoxy group, a nitro group, an alkylsulfonyl group, an alkyloxycarbonyl group, a cyan group, and a halogen atom.

As the alkyl group, for example, a linear, branched, or cyclic alkyl group having 1 to 18 carbon atoms is preferable, an alkyl group having 1 to 8 carbon atoms (for example, a methyl group, an ethyl group, a propyl group, an isopropyl group, an n-butyl group, an isobutyl group, a sec-butyl group, a t-butyl group, and a cyclohexyl group) is more preferable, an alkyl group having 1 to 4 carbon atoms is still more preferable, and the methyl group or the ethyl group is particularly preferable.

As the alkoxy group, for example, an alkoxy group having 1 to 18 carbon atoms is preferable, an alkoxy group having 1 to 8 carbon atoms (for example, a methoxy group, an ethoxy group, an n-butoxy group, and a methoxyethoxy group) is more preferable, an alkoxy group having 1 to 4 carbon atoms is still more preferable, and the methoxy group or the ethoxy group is particularly preferable.

Examples of the halogen atom include a fluorine atom, a chlorine atom, a bromine atom, and an iodine atom, and the fluorine atom or the chlorine atom is preferable.

In addition, in Formulae (Ar-1) to (Ar-7), $Z^1$, $Z^2$, and $Z^3$ each independently represent a hydrogen atom, a monovalent aliphatic hydrocarbon group having 1 to 20 carbon atoms, a monovalent alicyclic hydrocarbon group having 3 to 20 carbon atoms, a monovalent aromatic hydrocarbon ring group having 6 to 20 carbon atoms, a halogen atom, a cyano group, a nitro group, —$NR^6R^7$, or —$SR^8$, $R^6$ to $R^8$ each independently represent a hydrogen atom or an alkyl group having 1 to 6 carbon atoms, and $Z^1$ and $Z^2$ may be bonded to each other to form a ring. The ring may be any of an alicyclic ring, a heterocyclic ring, and an aromatic ring, and is preferably the aromatic ring. In addition, a ring thus formed may be substituted with a substituent.

As the monovalent aliphatic hydrocarbon group having 1 to 20 carbon atoms, an alkyl group having 1 to 15 carbon atoms is preferable, an alkyl group having 1 to 8 carbon atoms is more preferable, a methyl group, an ethyl group, an isopropyl group, a tert-pentyl group (1,1-dimethylpropyl group), a tert-butyl group, or a 1,1-dimethyl-3,3-dimethylbutyl group is still more preferable, and the methyl group, the ethyl group, or the tert-butyl group is particularly preferable.

Examples of the monovalent alicyclic hydrocarbon group having 3 to 20 carbon atoms include a monocyclic saturated hydrocarbon group such as a cyclopropyl group, a cyclobutyl group, a cyclopentyl group, a cyclohexyl group, a cycloheptyl group, a cyclooctyl group, a cyclodecyl group, a methylcyclohexyl group, and ethylcyclohexyl group; a monocyclic unsaturated hydrocarbon group such as a cyclobutenyl group, a cyclopentenyl group, a cyclohexenyl group, a cycloheptenyl group, a cyclooctenyl group, a cyclodecenyl group, a cyclopentadienyl group, a cyclohexadienyl group, a cyclooctadienyl group, and a cyclodecadiene group; and a polycyclic saturated hydrocarbon group such as a bicyclo[2.2.1]heptyl group, a bicyclo[2.2.2]octyl group, a tricyclo[5.2.1.0$^{2,6}$]decyl group, a tricyclo[3.3.1.1$^{3,7}$]decyl group, a tetracyclo[6.2.1.1$^{3,6}$.0$^{2,7}$]dodecyl group, and an adamantyl group, Examples of the monovalent aromatic hydrocarbon ring group having 6 to 20 carbon atoms include a phenyl group, a 2,6-diethylphenyl group, a naphthyl group, and a biphenyl group, and an aryl group having 6 to 12 carbon atoms (particularly a phenyl group) is preferable.

Examples of the halogen atom include a fluorine atom, a chlorine atom, a bromine atom, and an iodine atom, and the fluorine atom, the chlorine atom, or the bromine atom is preferable.

On the other hand, examples of the alkyl group having 1 to 6 carbon atoms represented by each of $R^6$ to $R^8$ include a methyl group, an ethyl group, a propyl group, an isopropyl group, an n-butyl group, an isobutyl group, a sec-butyl group, a tert-butyl group, an n-pentyl group, and an n-hexyl group.

In addition, in Formulae (Ar-2) and (Ar-3), $A^3$ and $A^4$ each independently represent a group selected from the group consisting of —O—, —N($R^9$)—, —S—, and —CO—, and $R^9$ represents a hydrogen atom or a substituent.

Examples of the substituent represented by $R^9$ include the same ones as the substituents which may be contained in $Y^1$ in Formula (Ar-1).

Furthermore, in Formula (Ar-2), X represents a hydrogen atom or a non-metal atom of Groups 14 to 16 to which a substituent may be bonded.

Moreover, examples of the non-metal atom of Groups 14 to 16 represented by X include an oxygen atom, a sulfur atom, a nitrogen atom having a substituent, and a carbon atom having a substituent, and examples of the substituent include the same ones as the substituents which may be contained in $Y^1$ in Formula (Ar-1).

In addition, in Formula (Ar-3), $D^5$ and $D^6$ each independently represent a single bond, —O—CO—, —C(=S)O—, —$CR^1R^2$—, —$CR^1R^2$—$CR^3R^4$—, —O—$CR^1R^2$—, —$CR^1R^2$—O—$CR^3R^4$—, —CO—O—$CR^1R^2$—, —O—CO—$CR^1R^2$—, —$CR^1R^2$—O—CO—$CR^3R^4$—, —$CR^1R^2$—CO—O—$CR^3R^4$—, —$NR^1$—$CR^2R^3$—, or —CO—$NR^1$—. $R^1$, $R^2$, $R^3$, and $R^4$ each independently represent a hydrogen atom, a fluorine atom, or an alkyl group having 1 to 4 carbon atoms.

Moreover, in Formula (Ar-3), $SP^3$ and $SP^4$ each independently represent a single bond, a linear or branched alkylene group having 1 to 12 carbon atoms, or a divalent linking group in which one or more of —$CH_2$—'s constituting the linear or branched alkylene group having 1 to 12 carbon atoms are substituted with —O—, —S—, —N(Q)-, or —CO—, and Q represents a polymerizable group.

Furthermore, in Formula (Ar-3), $L^3$ and $L^4$ each independently represent a monovalent organic group (for example, an alkyl group and a polymerizable group), and at least one of $L^3$ or $L^4$, or $L^1$ or $L^2$ in Formula (I) represents a polymerizable group.

Moreover, in Formulae (Ar-4) and (Ar-7), Ax represents an organic group having 2 to 30 carbon atoms, which has at least one aromatic ring selected from the group consisting of an aromatic hydrocarbon ring and an aromatic heterocyclic ring.

Furthermore, in Formulae (Ar-4) to (Ar-7), Ay represents a hydrogen atom, an alkyl group having 1 to 6 carbon atoms, which may have a substituent, or an organic group having 2 to 30 carbon atoms, which has at least one aromatic ring selected from the group consisting of an aromatic hydrocarbon ring and an aromatic heterocyclic ring.

Here, the aromatic ring in each of Ax and Ay may have a substituent, and Ax and Ay may be bonded to each other to form a ring.

In addition, $Q^3$ represents a hydrogen atom or an alkyl group having 1 to 6 carbon atoms, which may have a substituent.

Examples of Ax and Ay include those described in paragraphs 0039 to 0095 of WO2014/010325A.

Incidentally, examples of the alkyl group having 1 to 6 carbon atoms represented by $Q^3$ include a methyl group, an ethyl group, a propyl group, an isopropyl group, an n-butyl group, an isobutyl group, a sec-butyl group, a tert-butyl group, an n-pentyl group, and an n-hexyl group, and examples of the substituent include the same ones as the substituents which may be contained in $Y^1$ in Formula (Ar-1).

Among those, from the viewpoint that the effect of the present invention is more excellent, it is preferable that at least one of $A^1$ or $A^2$ is a cycloalkylene ring having 6 or more carbon atoms, and it is more preferable that one of $A^1$ and $A^2$ is a cycloalkylene ring having 6 or more carbon atoms.

The content of the liquid crystal compound in the composition is not particularly limited, but is preferably 50% by mass or more, and more preferably 70% by mass or more with respect to the total solid content in the composition. An upper limit thereof is not particularly limited, but is often 90% by mass or less.

In addition, the total solid content in the composition does not include a solvent, Furthermore, the composition may further include a forward wavelength dispersion liquid crystal compound. The forward wavelength dispersion liquid crystal compound means a compound in which an optically anisotropic film formed using the compound exhibits forward wavelength dispersibility. The expression that an optically anisotropic film exhibits forward wavelength dispersibility means that the in-plane retardation of the optically anisotropic film decreases as a measurement wavelength increases.

Addition of a forward wavelength dispersion liquid crystal compound makes it possible to adjust the wavelength dispersion of a composition and impart wavelength dispersibility closer to ideal wavelength dispersion.

Polymer

The type of the polymer is not particularly limited, but is preferably a reverse wavelength dispersible polymer. The reverse wavelength dispersible polymer means a polymer which is used to form an optically anisotropic film exhibiting reverse wavelength dispersibility.

One of suitable aspects of the polymer may be a polymer including one or more repeating units selected from the group consisting of a repeating unit represented by Formula (7) and a repeating unit represented by Formula (8).

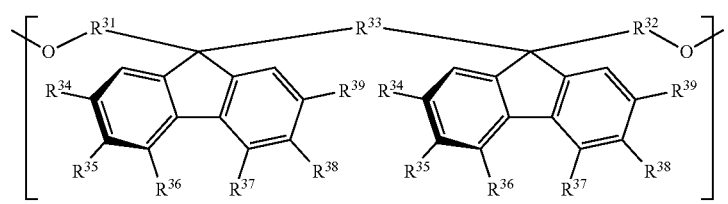

Formula (7)

-continued

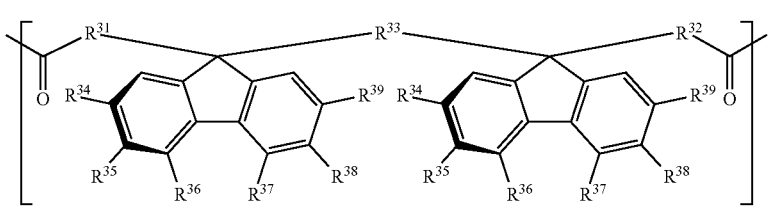

Formula (8)

In Formulae (7) and (8), $R^{31}$ to $R^{33}$ each independently represent a direct bond or an alkylene group having 1 to 4 carbon atoms, which may have a substituent.

$R^{34}$ to $R^{39}$ each independently represent a hydrogen atom, an alkyl group having 1 to 10 carbon atoms, which may have a substituent, an aryl group having 4 to 10 carbon atoms, which may have a substituent, a heteroaryl group having 4 to 10 carbon atoms, which may have a substituent, an acyl group having 1 to 10 carbon atoms, which may have a substituent, an alkoxy group having 1 to 10 carbon atoms, which may have a substituent, an aryloxy group having 1 to 10 carbon atoms, which may have a substituent, an acyloxy group having 1 to 10 carbon atoms, which may have a substituent, an amino group which may have a substituent, a vinyl group having 1 to 10 carbon atoms, which may have a substituent, an ethynyl group having 1 to 10 carbon atoms, which may have a substituent, a sulfur atom having a substituent, a silicon atom having a substituent, a halogen atom, a nitro group, or a cyano group. It should be noted that at least two adjacent groups of $R^{34}$, . . . , or $R^{39}$ may be bonded to each other to form a ring.

In addition, each two of $R^{34}$'s, $R^{35}$'s, $R^{36}$'s, $R^{37}$'s, $R^{38}$'s, and $R^{39}$'s included in Formula (7) may be the same as or different from each other. Similarly, each two of $R^{34}$'s, $R^{35}$'s, $R^{36}$'s, $R^{37}$'s, $R^{38}$'s, and $R^{39}$'s included in Formula (8) may be the same as or different from each other.

Other suitable aspects of the polymer include a polymer including a repeating unit of Formula (9) and a repeating unit of Formula (11).

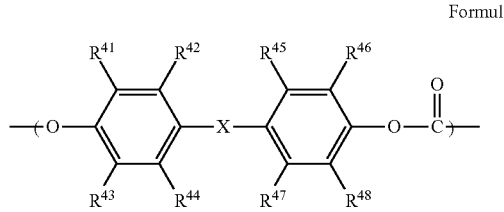

Formula (9)

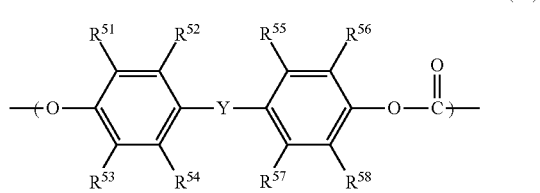

Formula (11)

In Formula (9), $R^{41}$ to $R^{48}$ each independently represent a hydrogen atom, a halogen atom, or a hydrocarbon group having 1 to 6 carbon atoms.

X represents a group represented by Formula (10). In Formula (10), * represents a bonding position.

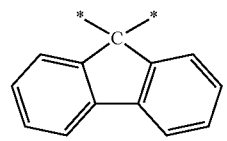

Formula (10)

In Formula (11), $R^{51}$ to $R^{58}$ each independently represent a hydrogen atom, a halogen atom, or a hydrocarbon group having 1 to 22 carbon atoms.

Y represents —$C(R^{61})(R^{62})$—, a group represented by Formula (12), —$Si(R^{67})(R^{68})$—, —$SO_2$—, —S—, a divalent aliphatic hydrocarbon group, —$C(CH_3)_2$-phenylene group-$C(CH_3)_2$—, —CO—O-L-O—CO—.

In Formula (12), * represents a bonding position.

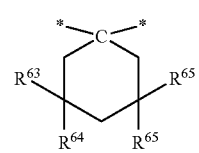

Formula (12)

$R^{61}$, $R^{62}$, $R^{67}$, and $R^{68}$ each independently represent a hydrogen atom, a halogen atom, or a hydrocarbon group having 1 to 22 carbon atoms (for example, an aryl group having 6 to 10 carbon atoms).

$R^{63}$ to $R^{66}$ each independently represent a hydrogen atom or an alkyl group.

L represents a divalent aliphatic hydrocarbon group.

The content of the repeating unit represented by Formula (9) in the polymer is not particularly limited, but is preferably 30% to 90% by mole with respect to all the repeating units.

The content of the repeating unit represented by Formula (11) in the polymer is not particularly limited, but is preferably 10% to 70% by mole with respect to all the repeating units.

Other suitable aspects of the polymer include cellulose acylate.

As the cellulose acylate, a lower fatty acid ester of cellulose is preferable. The lower fatty acid means a fatty acid having 6 or less carbon atoms. The fatty acid preferably has 2 carbon atoms (cellulose acetate), 3 carbon atoms (cellulose propionate), or 4 carbon atoms (cellulose butyrate). In addition, mixed fatty acid esters such as cellulose acetate propionate and cellulose acetate butyrate may be used.

The acetylation degree of cellulose acetate is preferably 55.0% to 62.5%, more preferably 57.0% to 62.0%, and still more preferably 58.5% to 61.5%.

The acetylation degree means an amount of bonded acetic acid per unit mass of cellulose. The acetylation degree follows the measurement and computation of the acetylation degree in ASTM: D-817-91 (a test method for cellulose acetate and the like).

Furthermore, in a case where cellulose acylate is used as the polymer, additives such as a plasticizer, a deterioration inhibitor, a retardation enhancer, and an ultraviolet absorber may be used in combination.

Examples of the additive include those exemplified in JP2004-050516A.

The content of the polymer in the composition is not particularly limited, but is preferably 50% by mass or more, and more preferably 70% by mass or more with respect to the total solid content in the composition. An upper limit thereof is not particularly limited, but is often 98% by mass or less.

In addition, the total solid content in the composition does not include a solvent.

Other Components

The composition may include components other than the above-mentioned specific coloring agent, liquid crystal compound, and polymer.

The composition may include a polymerization initiator. The polymerization initiator to be used is selected according to the type of a polymerization reaction, and examples thereof include a thermal polymerization initiator and a photopolymerization initiator. Examples of the photopolymerization initiator include an α-carbonyl compound, an acyloin ether, an α-hydrocarbon substituted aromatic acyloin compound, a polynuclear quinone compound, and a combination of a triarylimidazole dimer and a p-aminophenyl ketone.

The content of the polymerization initiator in the composition is preferably 0.01% to 20% by mass, and more preferably 0.5% to 10% by mass with respect to the total solid content of the composition.

In addition, the composition may include a polymerizable monomer.

Examples of the polymerizable monomer include a radically polymerizable or canonically polymerizable compound. Among those, a polyfunctional radically polymerizable monomer is preferable. In addition, as the polymerizable monomer, a monomer which is copolymerizable with the liquid crystal compound having a polymerizable group is preferable. Examples of the polymerizable monomer include those described in paragraphs 0018 to 0020 of JP2002-296423A.

The content of the polymerizable monomer in the composition is preferably 1% to 50% by mass, and more preferably 2% to 30% by mass with respect to the total mass of the liquid crystal compound.

Moreover, the composition may include a surfactant.

Examples of the surfactant include compounds known in the related art, but a fluorine-based compound is preferable. Examples of the compound include the compounds described in paragraphs 0028 to 0056 of JP2001-330725A and the compounds described in paragraphs 0069 to 0126 of JP2003-295212A.

Furthermore, the composition may include a solvent. As the solvent, an organic solvent is preferable. Examples of the organic solvent include an amide (for example, N,N-dimethylformamide), a sulfoxide (for example, dimethyl sulfoxide), a heterocyclic compound (for example, pyridine), a hydrocarbon (for example, benzene and hexane), an alkyl halide (for example, chloroform and dichloromethane), an ester (for example, methyl acetate, ethyl acetate, and butyl acetate), a ketone (for example, acetone and methyl ethyl ketone), and an ether (for example, tetrahydrofuran and 1,2-dimethoxyethane). In addition, two or more kinds of the organic solvents may be used in combination.

Moreover, the composition may include various alignment control agents such as a vertical alignment agent and a horizontal alignment agent. Such an alignment control agent is a compound capable of controlling the horizontal or vertical alignment of a liquid crystal compound at an interface.

In addition, the composition may include an adhesion improver and a plasticizer, in addition to the components.

Production Method

A method for producing the optically anisotropic film of the embodiment of the present invention is not particularly limited and examples thereof include known methods.

Among those, from the viewpoint that the in-plane retardation is easily controlled, a method in which a composition including a polymerizable liquid crystal compound and a specific coloring agent is applied to form a coating film, the coating film is subjected to an alignment treatment to align the polymerizable liquid crystal compound, and the obtained coating film is subjected to a curing treatment (irradiation with ultraviolet rays (light irradiation treatment) or a heating treatment) to form an optically anisotropic film is preferable.

Hereinafter, the procedure of the method will be described in detail.

First, the composition is applied onto a support to form a coating film and the coating film is subjected to an alignment treatment to align the polymerizable liquid crystal compound.

The composition to be used includes a polymerizable liquid crystal compound. The definition of the polymerizable liquid crystal compound is the same as mentioned above.

The support to be used is a member having a function as a base material for applying a composition thereon. The support may be a temporary support which is peeled after applying the composition and performing curing.

As the support (temporary support), a glass substrate may be used, in addition to a plastic film. Examples of a material constituting the plastic film include a polyester resin such as polyethylene terephthalate (PET), a polycarbonate resin, a (meth)acryl resin, an epoxy resin, a polyurethane resin, a polyamide resin, a polyolefin resin, a cellulose derivative, a silicone resin, and polyvinyl alcohol (PVA).

The thickness of the support only needs to be about 5 to 1,000 μm, and is preferably 10 to 250 μm, and more preferably 15 to 90 μm.

Moreover, an alignment layer may be arranged on the support, as desired.

The alignment layer generally includes a polymer as a main component. Polymer materials for an alignment layer are described in many documents and a large number of commercially available products thereof can be obtained. As the polymer material for an alignment layer, polyvinyl alcohol, polyimide, or a derivative thereof is preferable.

In addition, it is preferable that the alignment layer is subjected to a known rubbing treatment.

The thickness of the alignment layer is preferably 0.01 to 10 μm, and more preferably 0.01 to 1 μm.

Examples of a method for applying the composition include a curtain coating method, a dip coating method, a spin coating method, a printing coating method, a spray coating method, a slot coating method, a roll coating method, a slide coating method, a blade coating method, a gravure coating method, and a wire bar method. A single layer coating is preferable in a case of performing coating by any of these methods.

The coating film formed on the support is subjected to an alignment treatment to align the polymerizable liquid crystal compound in the coating film. The specific coloring agent also tends to be aligned in a predetermined direction according to the alignment of the polymerizable liquid crystal compound.

The alignment treatment can be performed by drying the coating film at room temperature or heating the coating film. In a case of a thermotropic liquid crystal compound, a liquid crystal phase formed with the alignment treatment can generally be transferred by a change in a temperature or pressure. In a case of a lyotropic liquid crystal compound, the liquid crystal phase can also be transferred according to a compositional ratio such as the amount of a solvent.

Furthermore, the condition in a case of heating the coating film is not particularly limited, but the heating temperature is preferably 50° C. to 250° C., and more preferably 50° C. to 150° C., and the heating time is preferably 10 seconds to 10 minutes.

Moreover, before performing a curing treatment (light irradiation treatment) which will be described later, after heating the coating film, the coating film may be cooled, as desired. The cooling temperature is preferably 20° C. to 200° C., and more preferably 30° C. to 150° C.

Next, the coating film in which the polymerizable liquid crystal compound has been aligned is subjected to a curing treatment.

A method for the curing treatment to be carried out on the coating film in which the polymerizable liquid crystal compound has been aligned is not particularly limited, and examples thereof include a light irradiation treatment and a heating treatment. Among those, from the viewpoint of manufacturing suitability, the light irradiation treatment is preferable, and an ultraviolet ray-irradiation treatment is more preferable.

An irradiation condition for the light irradiation treatment is not particularly limited, but an irradiation dose of 50 to 1,000 mJ/cm$^2$ is preferable.

In the production method, by adjusting various conditions, the arrangement state of the specific coloring agent, and the like can be adjusted, and as a result, the optical characteristics of the optically anisotropic film can be adjusted.

For example, by adjusting a heating temperature during alignment of the liquid crystal compound after applying a composition onto the support to form a coating film and a cooling temperature during cooling after heating, the arrangement state of the specific coloring agent, and the like can be adjusted, and as a result, the optical characteristics of the optically anisotropic film can be adjusted.

Other aspects of the method for producing the optically anisotropic film of the embodiment of the present invention include a method in which an unstretched film is formed using a composition including a polymer and a specific coloring agent, and the obtained unstretched film is stretch-aligned to form an optically anisotropic film.

Examples of a method for forming an unstretched film include a method in which a composition including a polymer, a specific coloring agent, and a solvent is applied, and then the solvent is removed to form an unstretched film, and a method in which solid contents including a polymer and a specific coloring agent are molten without using a solvent to prepare a film.

Examples of the stretching method include known methods such as longitudinal uniaxial stretching, horizontal uniaxial stretching, or a combination thereof such as simultaneous biaxial stretching or sequential biaxial stretching.

Uses

The above-mentioned optically anisotropic film can be applied to various uses, and it can also be used as, for example, a so-called $\lambda/4$ plate or $\lambda/2$ plate by adjusting the in-plane retardation of the optically anisotropic Furthermore, the $\lambda/4$ plate is a plate having a function of converting linearly polarized light having a specific wavelength into circularly polarized light (or converting circularly polarized light into linearly polarized light). More specifically, the $\lambda/4$ plate is a plate in which an in-plane retardation Re at a predetermined wavelength of $\lambda$ nm is $\lambda/4$ (or an odd number of times thereof).

The in-plane retardation (Re(550)) of the $\lambda/4$ plate at a wavelength of 550 nm may have an error of about 25 nm from an ideal value (137.5 nm) at a center, and is, for example, preferably 110 to 160 nm, and more preferably 120 to 150 nm.

In addition, the $\lambda/2$ plate is an optically anisotropic film in which the in-plane retardation Re($\lambda$) at a specific wavelength of $\lambda$ nm satisfies Re($\lambda$)≈$\lambda/2$. This formula only needs to be satisfied at any wavelength (for example, 550 nm) in the visible region. Above all, it is preferable that the in-plane retardation Re(550) at a wavelength of 550 nm satisfies the fallowing relationship.

$$210 \text{ nm} \le Re(550) \le 300 \text{ nm}$$

In the optically anisotropic film, the degree $S_0$ of alignment order of the optically anisotropic film at a maximum absorption wavelength of the near-infrared absorbing coloring agent is not particularly limited, but in a case the optically anisotropic film is applied as an antireflection film of an organic electroluminescence EL display device, it is preferable to satisfy a relationship of Formula (B) from the viewpoint that the brightness of the organic EL display device is more excellent.

$$0.2 < S_0 < 1.0 \quad \text{Formula (B)}$$

In the present specification, the degree $S_0(\lambda)$ of alignment order of the optically anisotropic film at a wavelength of $\lambda$ nm is a value represented by Formula (C).

$$S_0(\lambda) = \{2 \cdot (A_p - A_v)\} / \{(A_p + 2A_v) \cdot (3 \cos^2 \theta - 1)\} \quad \text{Formula (C)}$$

In Formula (C), $A_p$ represents an absorbance for light which is polarized in the direction in parallel with a slow axis direction of the optically anisotropic film. $A_v$ represents an absorbance for light which is polarized in a direction perpendicular to the slow axis direction of the optically anisotropic film. $\theta$ represents an angle formed between the direction of the transition moment obtained above and the first eigenvector.

$A_p$ and $A_v$ of the optically anisotropic film can be determined by measuring the polarized light absorption of the optically anisotropic film. In addition, the measurement can be carried out using a spectrophotometer (MPC-3100 manufactured by SHIMADZU Corporation) equipped with a polarizer for infrared rays. $\lambda$ is a maximum absorption wavelength of an absorption spectrum obtained by measuring the absorption of the optically anisotropic film.

An optically anisotropic film and an optical film including the optically anisotropic film may be included in a display device. That is, examples of more specific uses of the optically anisotropic film include an optical compensation film for optical compensation of a liquid crystal cell, and an antireflection film for use in a display device such as an organic electroluminescence display device.

Among those, preferred aspects of the optical film include a circularly polarizing plate which includes an optically anisotropic film and a polarizer. This circularly polarizing plate can be suitably used as the antireflection film. That is, it is possible to further suppress a reflection tint in a display device including a display element (for example, an organic electroluminescence display element) and a circularly polarizing plate arranged on the display element.

Furthermore, the optically anisotropic film of the embodiment of the present invention is suitably used in an optical compensation film of an in plane switching (IPS) type liquid crystal display device, and can improve a tint change as viewed from a tilt direction and a light leakage upon black display.

Examples of the optical film including the optically anisotropic film include a circularly polarizing plate including a polarizer and an optically anisotropic film, as described above.

The polarizer only needs to be a member (linear polarizer) having a function of converting light into specific linearly polarized light, and an absorptive type polarizer can be usually used.

Examples of the absorptive type polarizer include an iodine-based polarizer, a dye-based polarizer using a dichroic dye, and a polyene-based polarizer. The iodine-based polarizer and the dye-based polarizer are classified into a coating type polarizer and a stretching type polarizer, both of which can be applied, but a polarizer which is manufactured by allowing polyvinyl alcohol to adsorb iodine or a dichroic dye and performing stretching is preferable.

A relationship between the absorption axis of the polarizer and the slow axis of the optically anisotropic film is not particularly limited, but in a case where the optically anisotropic film is a λ/4 plate and the optical film is used as a circularly polarizing film, an angle formed between the absorption axis of the polarizer and the slow axis of the optically anisotropic film is preferably 45°±10°.

EXAMPLES

Hereinafter, the features of the present invention will be described in more details with reference to Examples and Comparative Examples. The materials, the amounts of materials used, the proportions, the treatment details, the treatment procedure, and the like shown in Examples below can be appropriately modified as long as the modifications do not depart from the spirit of the present invention. Therefore, the scope of the present invention should not be construed as being limited to specific examples shown below.

Synthesis of Near-infrared Absorbing Coloring Agent

Synthesis of Near-Infrared Absorbing Coloring Agent D-1

A near-infrared absorbing coloring agent D-1 was synthesized according to the following scheme. A pyrrolopyrrole boron complex p-1 was synthesized according to the method for synthesizing a compound A-15 described in paragraphs 0271 and 0272 of WO2017/146092A. A carboxylic acid c-1 was synthesized according to the method for synthesizing a compound I-4C described in paragraphs 0122 to 0125 of JP2016-081035A. Moreover, a group adjacent to the acryloyloxy group in the structural formulae of the carboxylic acid c-1 and the near-infrared absorbing coloring agent D-1 represents a propylene group (a group in which the methyl group is substituted with an ethylene group), and the carboxylic acid c-1 and the near-infrared absorbing coloring agent D-1 represent a mixture of position isomers in which the positions of the methyl groups are different.

The pyrrolopyrrole boron complex p-1 (2.00 g, 1.96 mmol), the carboxylic acid c-1 (3.95 g, 7.83 mmol), 1-ethyl-3-(3-dimethylaminopropyl)carbodiimide hydrochloride (1.65 g, 8.61 mmol), 4-dimethylaminopyridine (0.13 g, 1.06 mmol), dibutylhydroxytoluene (40 mg, 0.18 mmol), and N,N-dimethylacetamide (60 ml) were mixed at room temperature. The temperature of the obtained mixed solution was raised to 70° C., the mixed solution was stirred for 2 hours, and then the temperature was lowered to room temperature. Methanol (200 ml) was added dropwise to the mixed solution, and the precipitated crystals were recovered by filtration. The obtained crystals were redissolved in chloroform (100 ml), methanol (200 ml) and hexane (100 ml) were added to the obtained solution to perform recrystallization, and the precipitated crystals were collected by filtration to obtain a near-infrared absorbing coloring agent D-1 (3.75 g, 1.88 mmol) in the form of a green solid (yield 96%). The structure of the near-infrared absorbing coloring agent D-1 was identified by $^1$H-NMR.

$^1$H-NMR (solvent: CDCl$_3$) δ (ppm): 1.29 (t, 6H), 1.69 (m, 8H), 2.30 (m, 8H), 2.61 (m, 12H), 2.95 (t, 4H), 3.29 (s, 6H), 4.10-4.32 (m, 8H), 5.20 (m, 2H), 5.85 (dd, 2H), 6.12 (ddd, 2H), 6.41 (dd, 2H), 6.59 (d, 6H), 6.68 (m, 6H), 7.01 (d, 4H), 7.20 (m, 16H), 7.30 (m, 12H)

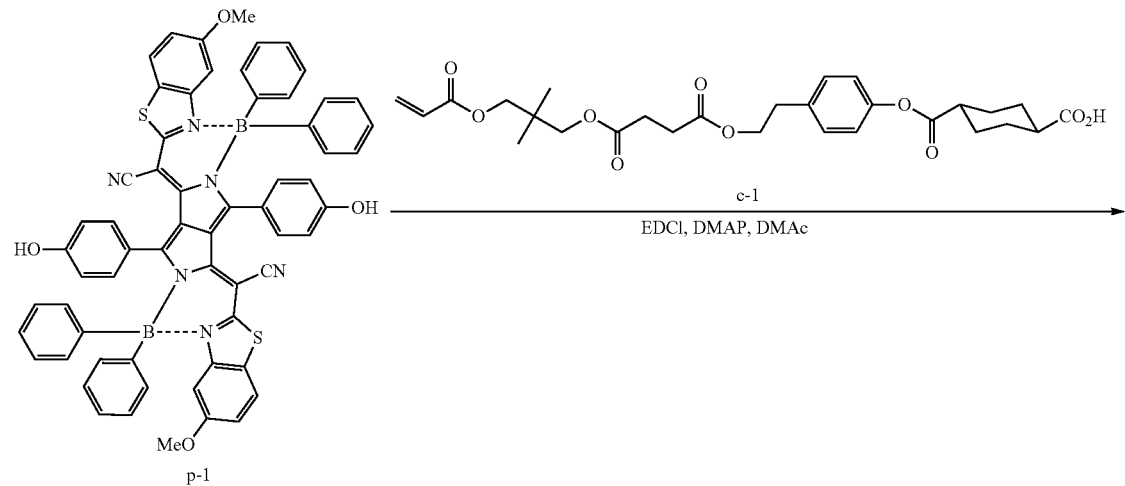

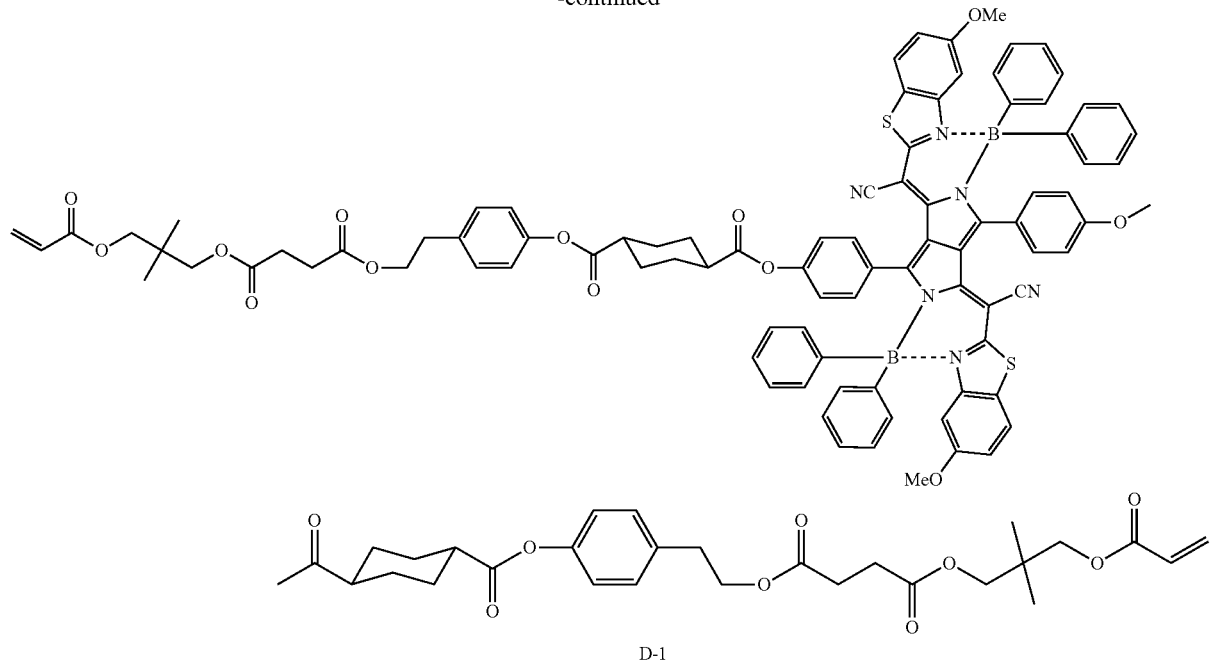

D-1

Synthesis of Near-Infrared Absorbing Coloring Agent D-2

A near-infrared absorbing coloring agent D-2 was synthesized by the same method as the method for synthesizing the near-infrared absorbing coloring agent D-1, using the following pyrrolopyrrole boron complex p-2 instead of the pyrrolopyrrole boron complex p-1.

Furthermore, the pyrrolopyrrole boron complex p-2 was synthesized according to the method for synthesizing a compound A-9 described in paragraph 0267 of WO2017/146092A. The structure of the near-infrared absorbing coloring agent D-2 was identified by $^1$H-NMR.

$^1$H-NMR (solvent: CDCl$_3$) δ (ppm): 1.29 (t, 6H), 1.70 (m, 8H), 2.32 (m, 8H), 2.61. (m, 12H), 2.95 (t, 4H), 4.10-4.32 (m, 8H), 5.20 (m, 2H), 5.85 (dd, 2H), 6.12 (ddd, 2H), 6.41 (dd, 2H), 6.59 (d, 4H), 6.68 (m, 4H), 7.00-7.22 (m, 22H), 7.30 (m, 12H), 7.50 (d, 2H)

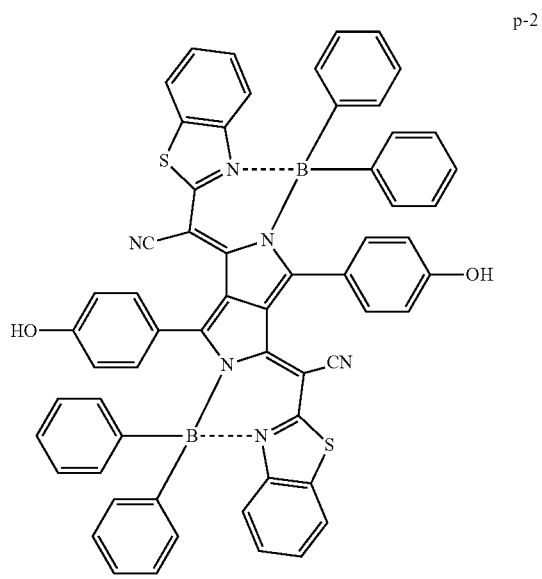

p-2

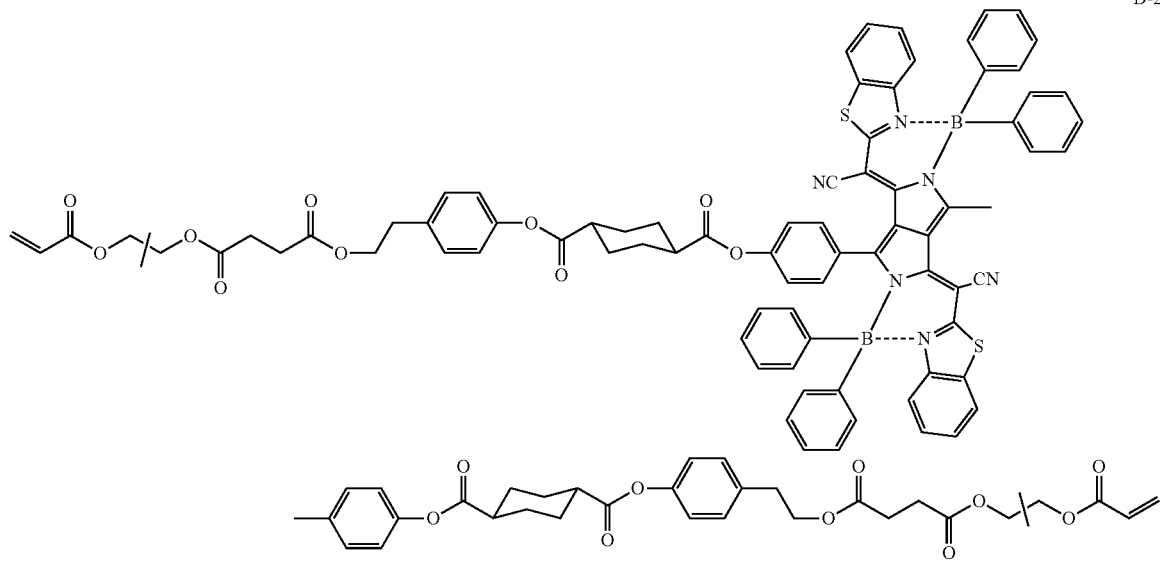
D-2
Synthesis of Near-Infrared Absorbing Coloring Agent D-3
A near-infrared absorbing coloring agent D-3 was synthesized according to the following scheme. A carboxylic acid a-1 was synthesized according to the method for synthesizing a compound P1-1 described in paragraphs 0088 to 0091 of WO2018/124198A.
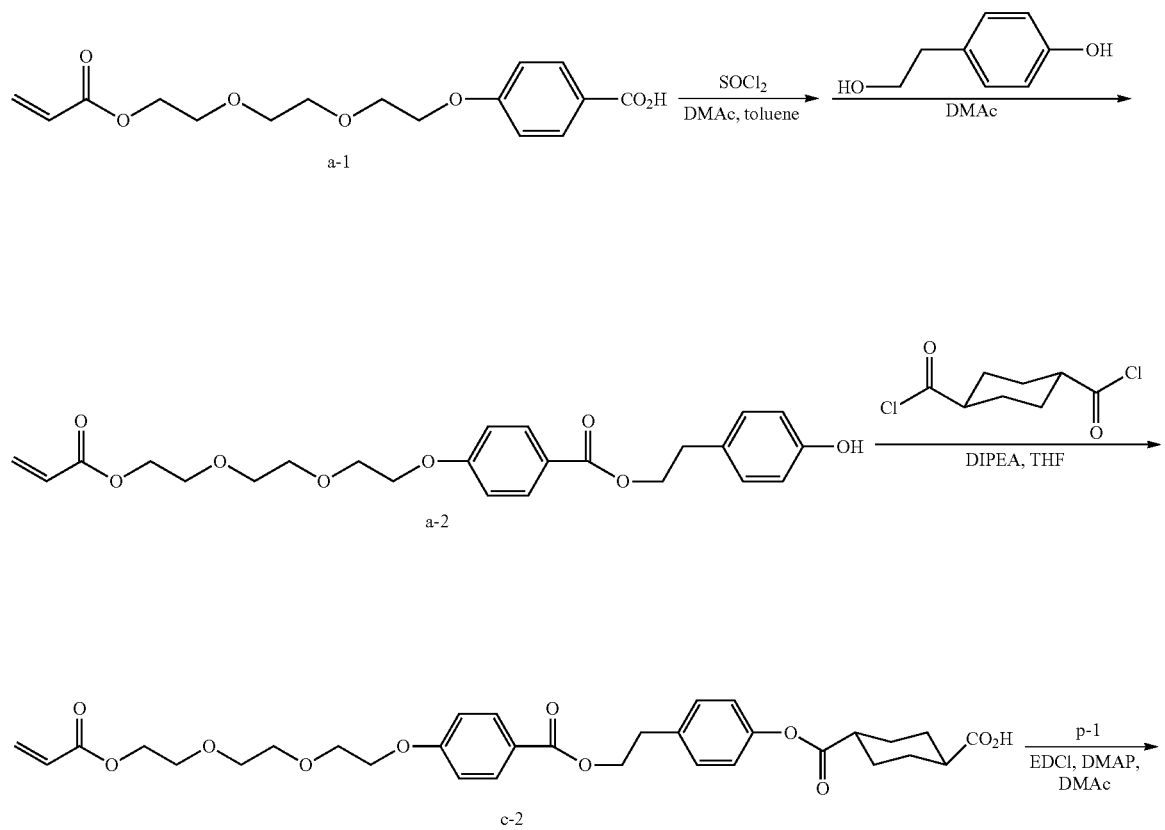

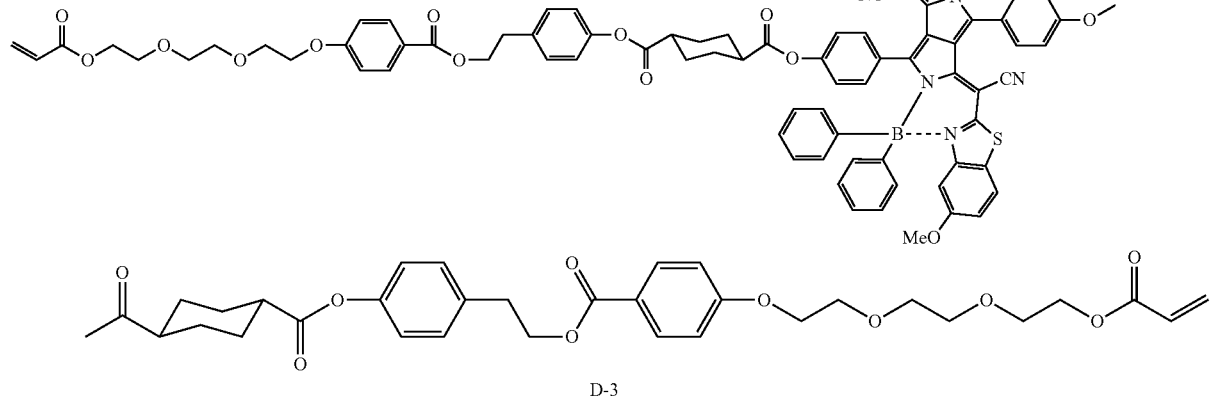

D-3

Synthesis of Compound a-2

The carboxylic acid a-1 (10.0 g, 30.8 mmol), 2,2,6,6-tetramethylpiperidin-1-oxyl (12.0 mg, 0.77 mmol), toluene (20 ml), and N,N-dimethylacetamide (5.5 ml) were mixed at room temperature. The obtained mixed solution was cooled to 5° C., and thionyl chloride (3.52 g, 29.6 mmol) was added dropwise to the mixed solution. The obtained mixed solution was stirred at an internal temperature of −5° C. to 3° C. for 1 hour, and then a mixture of 2-(4-hydroxyphenyl)ethanol (3.55 g, 25.7 mmol) and N,N-dimethylacetamide (13.0 ml) was added dropwise thereto. The temperature of the obtained mixed solution was raised to 52° C., the mixed solution was stirred for 7 hours, and then the temperature was lowered to room temperature. Distilled water and toluene were added to the mixed solution to perform liquid separation extraction. The organic layer was washed with 1 N aqueous hydrochloric acid, then washed twice with a saturated aqueous sodium bicarbonate solution, and further washed with saturated saline, and the obtained organic layer was dried over magnesium sulfate. Thereafter, magnesium sulfate was removed from the obtained solution by filtration, and the solvent was evaporated from the solution under reduced pressure. The obtained crude product was purified by silica gel column chromatography using ethyl acetate-hexane as a solvent to obtain a compound a-2 (6.03 g, 13.6 mmol) in the form of a white solid (yield: 53%).

Synthesis of Carboxylic Acid c-2

The compound a-2 (4.46 g, 10.0 mmol), cyclohexanedicarboxylic acid dichloride (6.29 g, 30.0 mmol), dibutylhydroxytoluene (66.0 mg, 0.30 mmol), and 67.0 mL of tetrahydrofuran were mixed at room temperature. The obtained mixed solution was cooled to 3° C., N,N-diisopropylethylamine (2.59 g, 20.0 mmol) was added dropwise thereto, and the obtained mixed solution was stirred for 1 hour. Methanesulfonic acid (130 μl) was added to the obtained mixed solution, the insoluble matter was filtered, and then 10% aqueous potassium carbonate (12.5 g) was added thereto to perform liquid separation extraction. The organic layer was washed with 17% aqueous potassium carbonate (20.4 g), and the obtained organic layer was dried over magnesium sulfate. Thereafter, magnesium sulfate was removed from the obtained solution by filtration, and the solvent was evaporated from the solution under reduced pressure. The obtained crude product was purified by silica gel column chromatography using ethyl acetate-hexane as a solvent to obtain a carboxylic acid c-2 (2.06 g, 3.43 mmol) in the form of a white solid (yield: 34.3%).

Synthesis of Near-Infrared Absorbing Coloring Agent D-3

A near-infrared absorbing coloring agent D-3 was synthesized by the same method as the method for synthesizing the near-infrared absorbing coloring agent D-1, using the carboxylic acid c-2 instead of the carboxylic acid c-1. The structure of the near-infrared absorbing coloring agent D-3 was identified by $^1$H-NMR.

$^1$H-NMR (solvent: CDCl$_3$) δ (ppm): 1.69 (m, 8H), 2.30 (m, 8H), 2.59 (m, 4H), 3.05 (t, 4H), 3.29 (s, 6H), 3.65-3.80 (m, 12H), 3.89 (t, 4H), 4.18 (t, 4H), 4.33 (t, 4H), 4.50 (t, 4H), 5.82 (d, 2H), 6.15 (dd, 2H), 6.40 (d, 2H), 6.59 (m, 6H), 6.68 (m, 6H), 6.92 (d, 4H), 7.04 (d, 4H), 7.20 (m, 12H), 7.30 (m, 14H), 7.94 (d, 4H)

Synthesis of Near-Infrared Absorbing Coloring Agent D-4

A near-infrared absorbing coloring agent D-4 was synthesized by the same method as the method for synthesizing the near-infrared absorbing coloring agent D-1, using the following pyrrolopyrrole boron complex p-3 instead of the pyrrolopyrrole boron complex p-1. Furthermore, the pyrrolopyrrole boron complex p-3 was synthesized according to the method for synthesizing a compound A-c described in paragraphs 0286 to 0289 of WO2017/146092A. The structure of the near-infrared absorbing coloring agent D-4 was identified by $^1$H-NMR.

$^1$H-NMR (solvent: CDCl$_3$) δ (ppm): 1.29 (t, 6H), 1.74 (m, 8H), 2.35 (m, 8H), 2.62 (m, 12H), 2.95 (t, 4H), 4.10-4.32 (m, 8H), 5.20 (m, 2H), 5.85 (dd, 2H), 6.12 (ddd, 2H), 6.30 (d, 4H), 6.41 (dd, 2H), 6.80 (d, 4H), 7.04 (d, 4H), 7.21 (m, 16H), 7.30 (m, 8H), 7.70 (s, 2H), 8.25 (s, 2H), 9.01 (s, 2H)

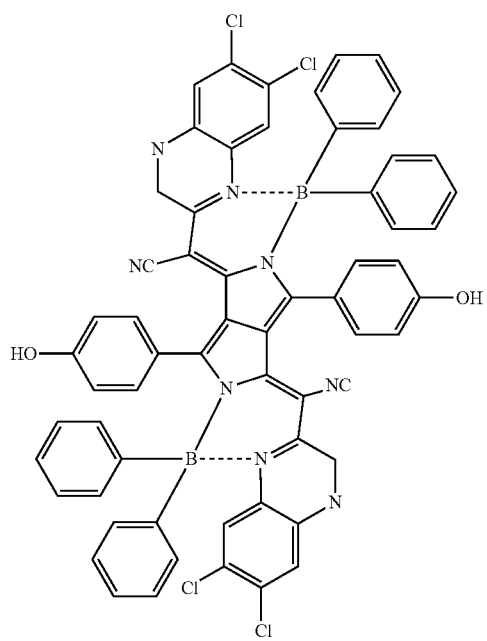
p-3
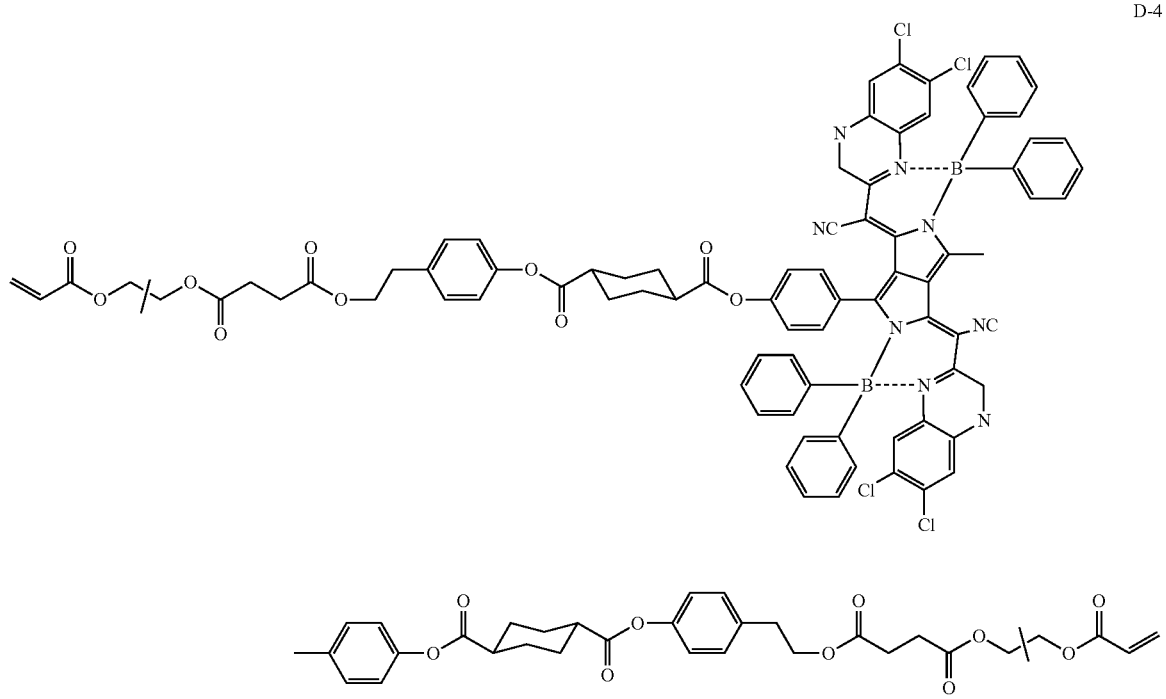
D-4
Synthesis of Near-Infrared Absorbing Coloring Agent D-5
A near-infrared absorbing coloring agent D-5 was synthesized according to the following scheme.
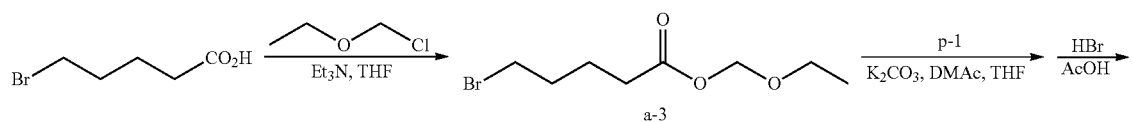

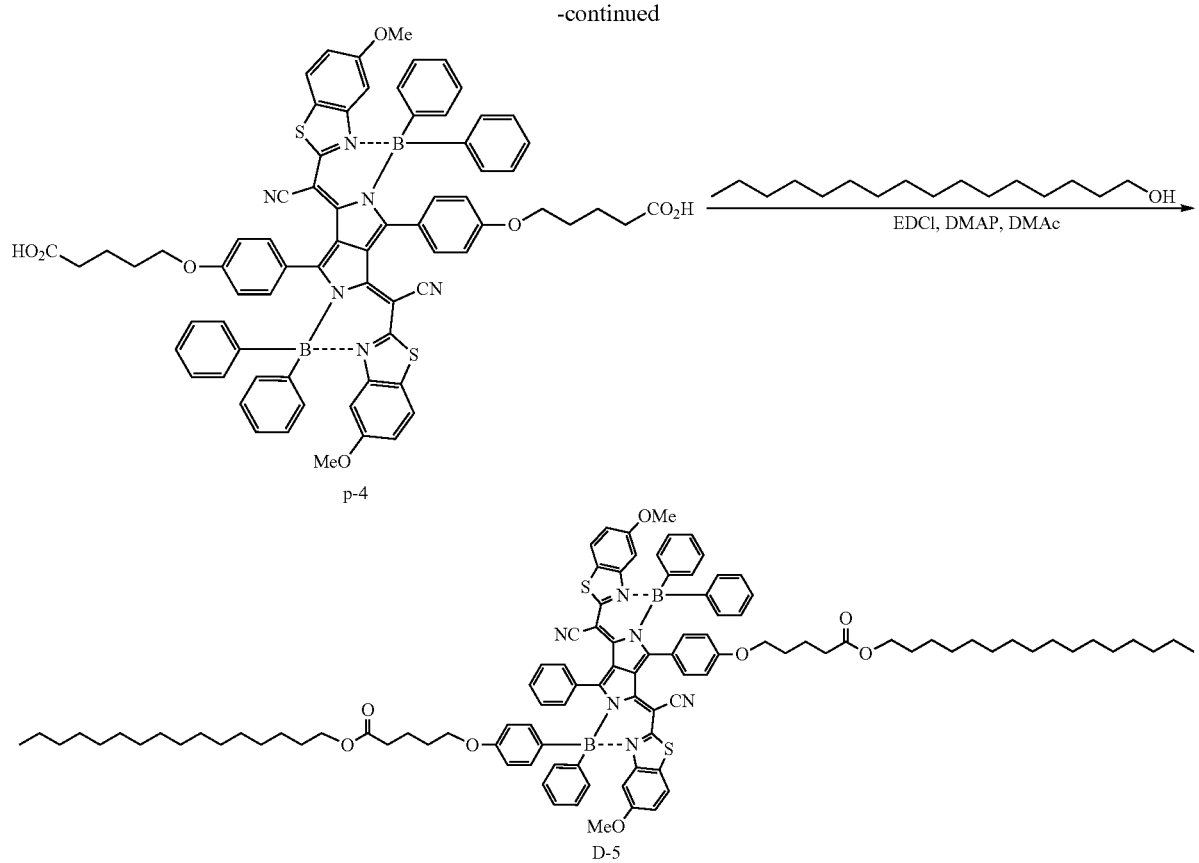

Synthesis of Compound a-3

5-Bronco-n-valeric acid (10.86 g, 60 mmol), tetrahydrofuran (THF) (108 ml), and triethylamine (7.89 g, 78 mmol) were mixed, and the obtained mixed solution were ice-cooled. Chloromethyl ethyl ether (7.37 g, 78 mmol) was added dropwise to the ice-cooled mixed solution, and the mixture was stirred for 3 hours while maintaining the temperature at 20° C. or lower. Water (0.8 ml) was added to the obtained mixed solution, the mixture was stirred for about 30 minutes, and then tertiary butyl methyl ether (108 ml) and a 1% aqueous sodium bicarbonate solution (108 ml) were added thereto to perform liquid separation extraction. The obtained organic layer was washed with brine, and the obtained organic layer was dried over sodium sulfate. Thereafter, sodium sulfate was removed from the obtained solution by filtration, and the solvent was evaporated from the solution to obtain an oily compound a-3 (14.36 g, 60.0 mmol) (yield: 100%).

Synthesis of Pyrrolopyrrole Boron Complex p-4

The compound a-3 (11.1 g, 46.4 mmol), the pyrrolopyrrole boron complex p-1 (5.92 g, 5.8 mmol), potassium carbonate (32.0 g, 232 mmol), THF (30 ml), and N,N-dimethylacetamide (30 ml) were mixed at room temperature. The temperature of the obtained mixed solution was raised to 80° C., the mixed solution was stirred for 4 hours, and then the temperature was lowered to room temperature. THF was evaporated from the obtained mixed solution under reduced pressure, and then acetonitrile (48 ml) was added thereto to crystallize the crystals. The precipitated crystals were recovered by filtration, the crystals were washed with acetonitrile and then dissolved in acetic acid (76 ml), a 30% hydrogen bromide acetic acid solution (6.6 ml) was added to the obtained solution, and the solution was stirred at 60° C. for 2 hours. The temperature of the solution was lowered to 20° C. or lower, and then the precipitated crystals were recovered by filtration and washed with acetonitrile. The obtained crystals were suspended and washed in THF (50 ml) and water (80 ml), recovered by filtration again, and then washed with acetonitrile to obtain a pyrrolopyrrole boron complex p-4 (4.86 g, 4.0 mmol) in the form of a green crystal (yield: 69%).

Synthesis of Near-Infrared Absorbing Coloring Agent D-5

The pyrrolopyrrole boron complex p-4 (0.61 g, 0.50 mmol), 1-hexadecanol (0.72 g, 3.0 mmol), 1-ethyl-3-(3-dimethylaminopropyl)carbodiimide hydrochloride (0.64 g, 3.3 mmol), 4-dimethylaminopyridine (75 mg, 0.60 mmol), dibutylhydroxytoluene (25 mg, 0.11 mmol), THF (10 ml), and N,N-dimethylacetamide (10 ml) were mixed at room temperature. The temperature of the obtained mixed solution was raised to 70° C., the mixed solution was stirred for 2 hours, and then the temperature was lowered to room temperature. Methanol (30 ml) was added dropwise to the mixed solution, and the precipitated crystals were recovered by filtration and washed with methanol to obtain a near-infrared absorbing coloring agent D-5 (0.13 g, 0.078 mmol) in the form of a green solid (yield: 16%). The structure of the near-infrared absorbing coloring agent D-5 was identified by $^1$H-NMR.

¹H-NMR (solvent: CDCl₃) δ (ppm): 0.89 (t, 6H), 1.29 (m, 52H), 1.65 (m, 4H), 1.85 (m, 8H), 2.42 (m, 4H), 3.29 (s, 6H), 3.93 (m, 4H), 4.10 (t, 4H), 6.46 (m, 10H), 6.69 (d, 2H), 7.15 (m, 12H), 7.23-7.35 (m, 10H)

Synthesis of Near-Infrared Absorbing Coloring Agent D-6

A near-infrared absorbing coloring agent D-6 was synthesized by the same method as the method for synthesizing the near-infrared absorbing coloring agent D-1, using 4-hexadecyloxybenzoic acid instead of the carboxylic acid c-1. The structure of the near-infrared absorbing coloring agent D-6 was identified by ¹H-NMR.

¹H-NMR (solvent: CDCl₃) δ (ppm): 0.89 (t, 6H), 1.29 (m, 48H), 1.49 (m, 4H), 1.82 (m, 4H), 3.29 (s, 6H), 4.10 (t, 4H), 6.61 (m, 6H), 6.70 (d, 2H), 6.81 (d, 4H), 6.98 (d, 4H), 7.11-7.29 (m, 12H), 7.32 (m, 10H), 8.18 (d, 4H)

and a light absorption coefficient ε(650) at a wavelength of 650 nm were calculated from the obtained spectrum and molecular weight. Further, εmax represents a wavelength indicating a maximum light absorption coefficient in the region of 600 nm or more. The results are shown in Table 1.

Computation of Most Stable Structure Using Density Functional Theory, and Main Component Analysis The moieties (structural moieties) consisting of the coloring agent skeletons of the near-infrared absorbing coloring agents D-1 to D-6 and the mesogenic groups bonded to the coloring agent skeletons were extracted, and the structures were optimized by computation using a density functional theory using Gaussian 16 manufactured by Gaussian, Inc. B3LYP was used as a functional of the density functional,

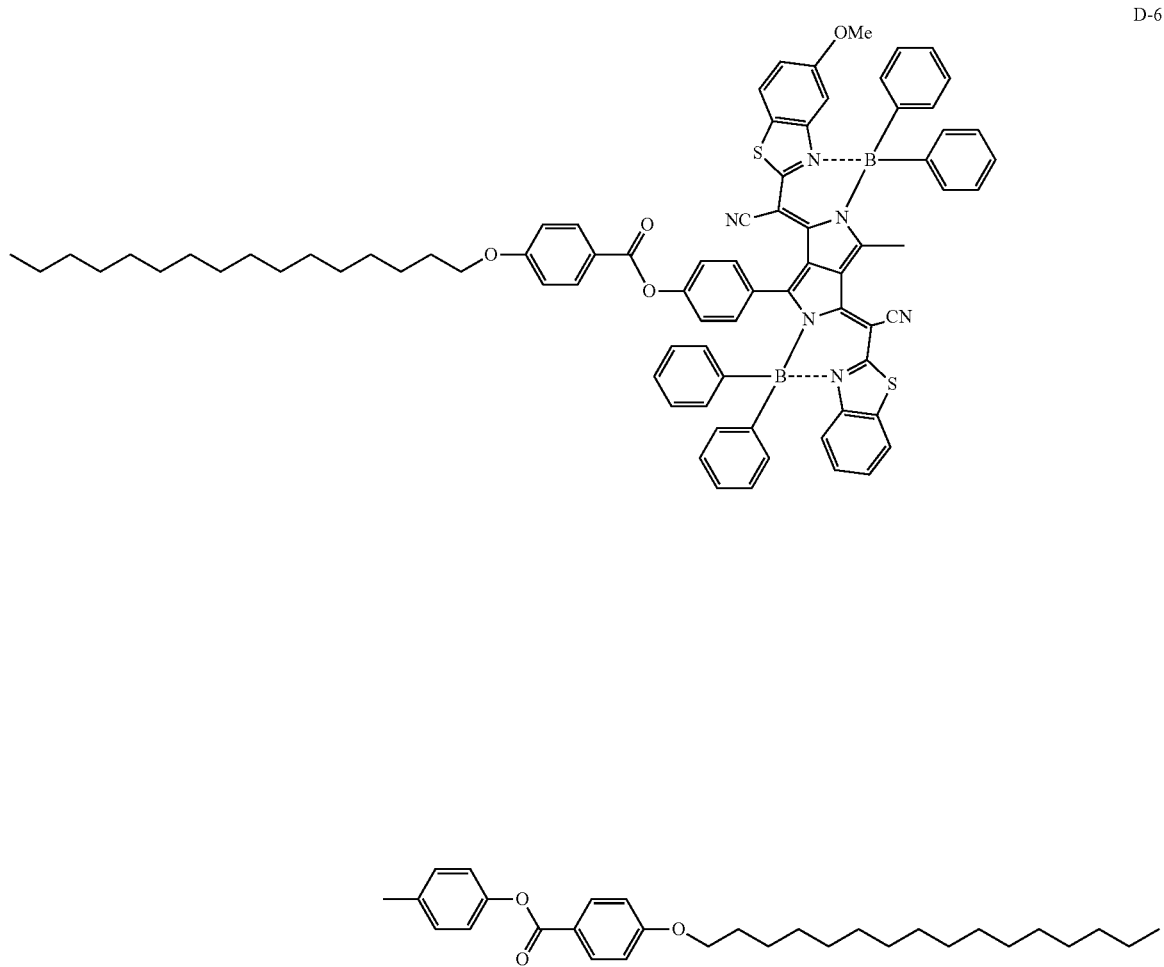

Measurement of Solution Absorption Spectrum

The solution absorption spectra of the near-infrared absorbing coloring agents D-1 to D-6 were measured using a spectrophotometer UV-3100PC manufactured by Shimadzu Corporation. A solution prepared by dissolving a predetermined amount (5 to 10 μmol/L) of the compound using chloroform as a solvent was measured in a 1-cm cell, and λmax, a light absorption coefficient ε(λmax) at λmax, 6-31G (d) was used as a base function, and the default values of Gaussian 16 were used as the other parameters.

The respective structural moieties used in the computation have structures in which another group (non-mesogenic group) bonded to the mesogenic group is substituted with a hydrogen atom, and are specifically the following compounds D-1' to D-6'.

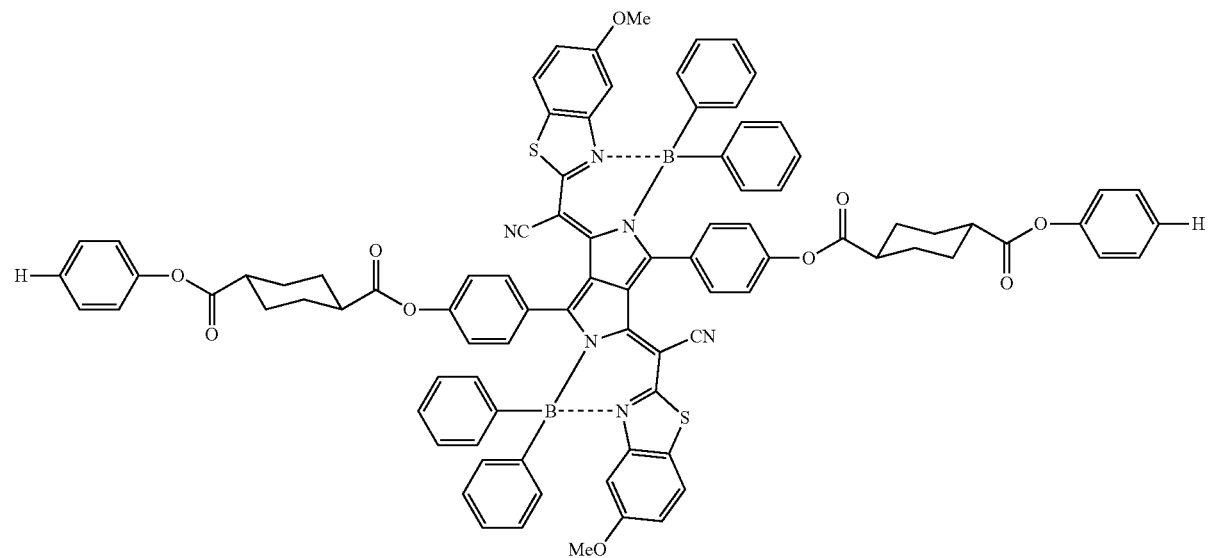
D-1'
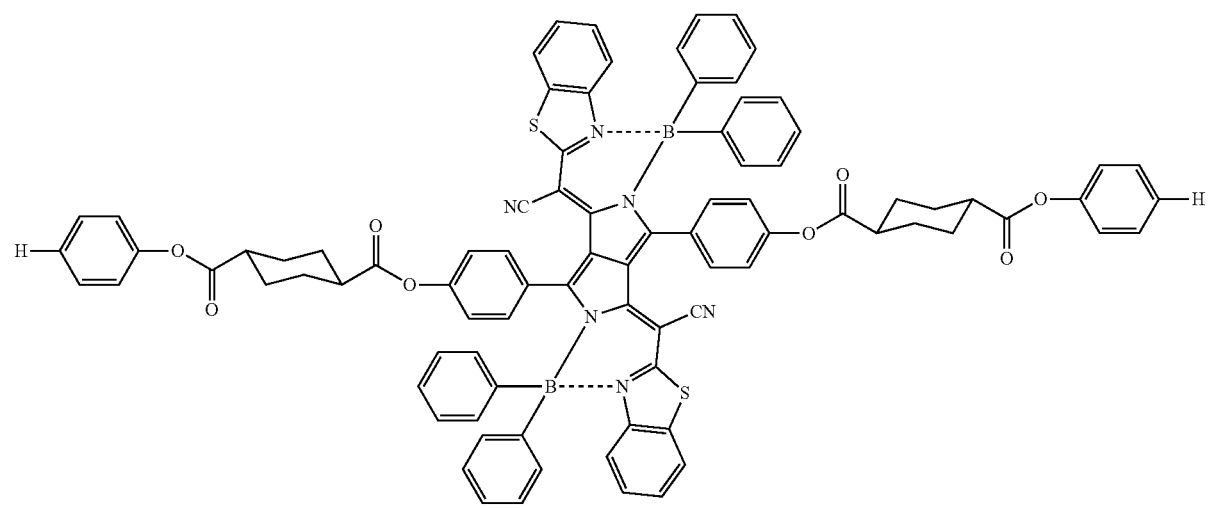
D-2'
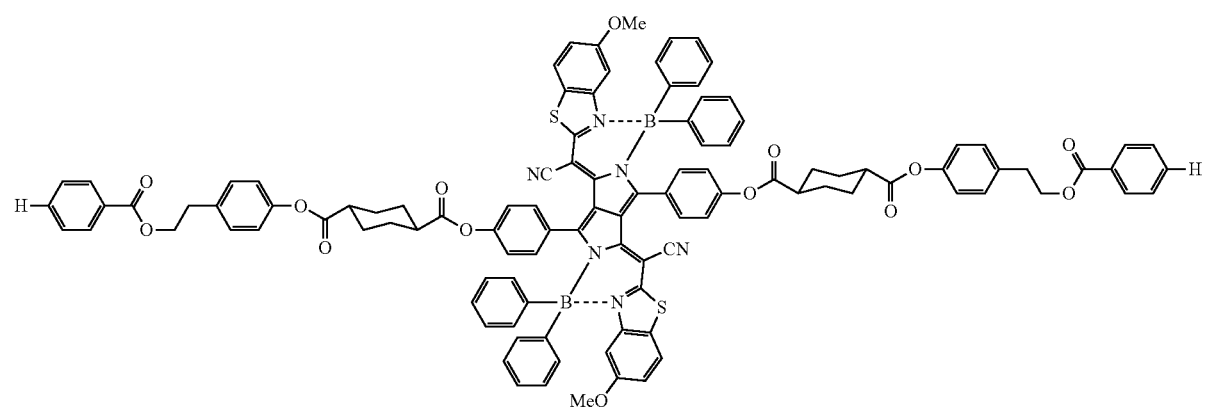
D-3'

-continued
D-4'
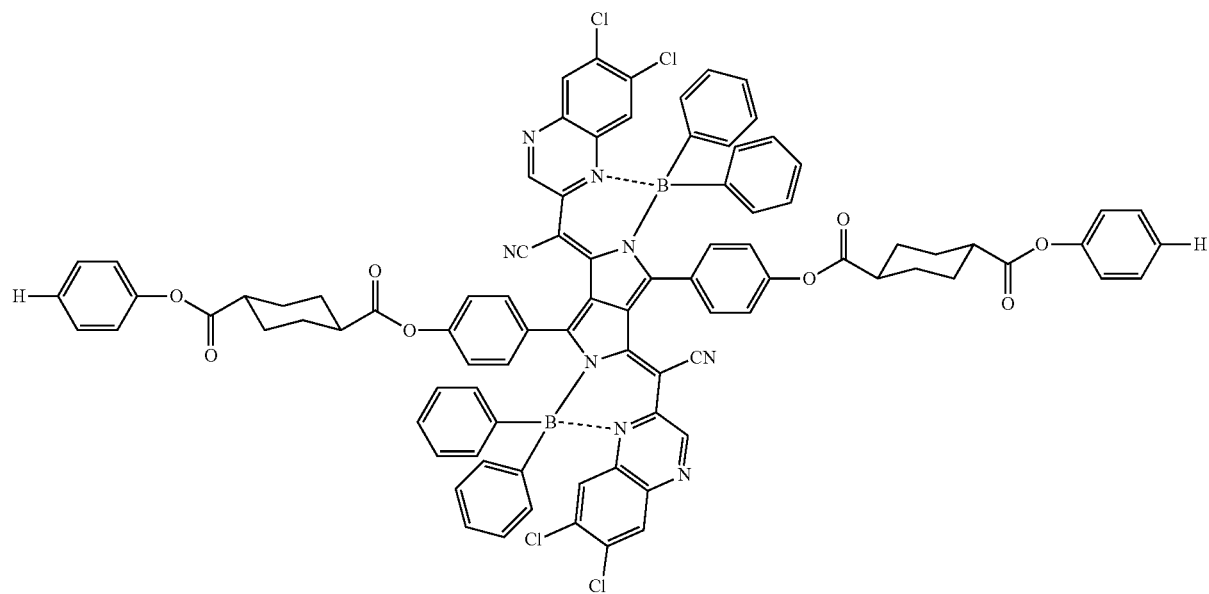
D-5'
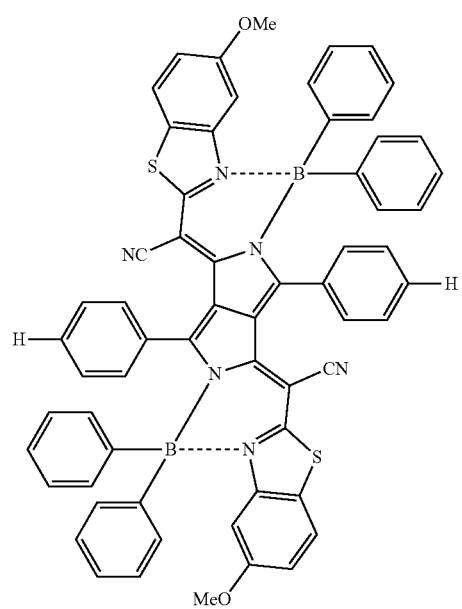

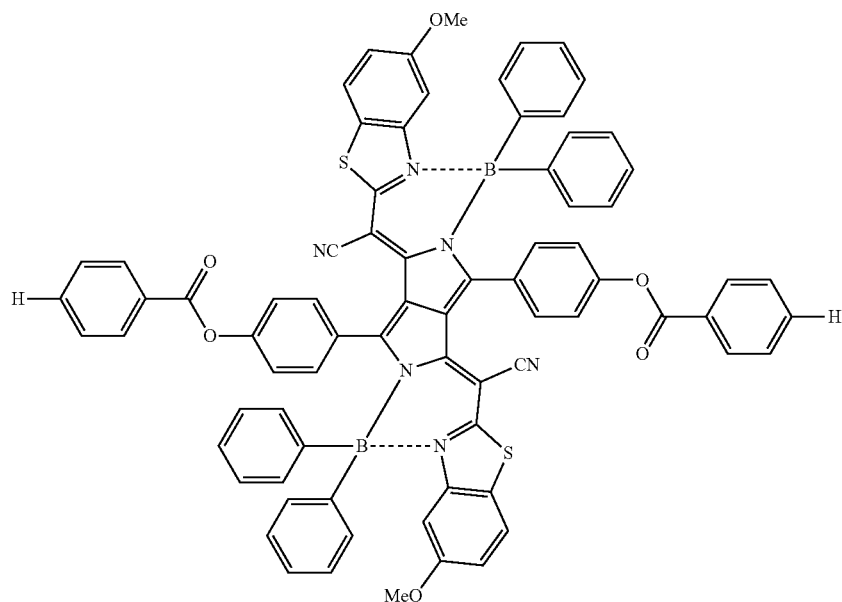

D-6'

Using the most stable structure obtained by computation, main component analysis was performed according to the above-mentioned method to determine a ratio λ2/λ1 of the absolute value λ2 of a square root of the second eigenvalue to the absolute value λ1 of a square root of the first eigenvalue. In addition, an angle formed between the direction of the transition moment obtained by the computation and the first eigenvector of the first eigenvalue obtained by the above-mentioned procedure was calculated. The results are shown in Table 1 below.

Example 1

The following coating liquid for an optically anisotropic film was prepared.

| | |
|---|---|
| The following liquid crystal compound L-1 | 43 parts by mass |
| The following liquid crystal compound L-2 | 43 parts by mass |
| The following liquid crystal compound L-3 | 14 parts by mass |
| Near-infrared absorbing coloring agent D-1 | 5 parts by mass |
| The following photopolymerization initiator P1-1 | 0.50 parts by mass |
| The following fluorine-containing compound F-1 | 0.20 parts by mass |
| Chloroform | 535 parts by mass |

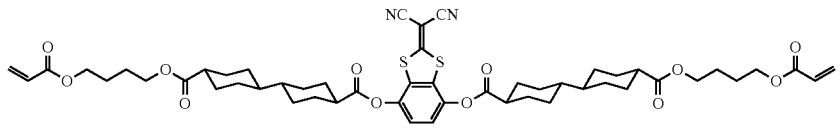

L-1

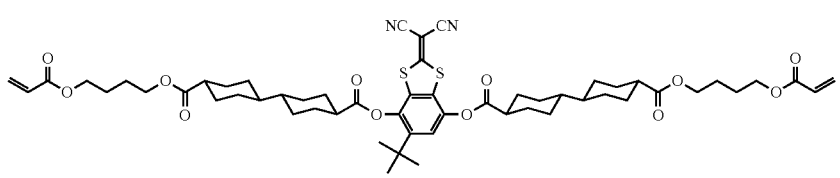

L-2

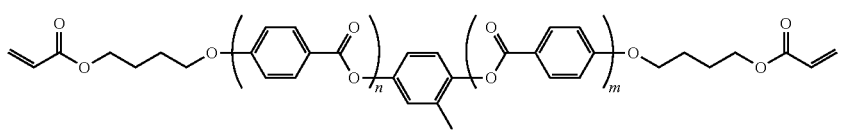

n, m = 1 or 2
L-3

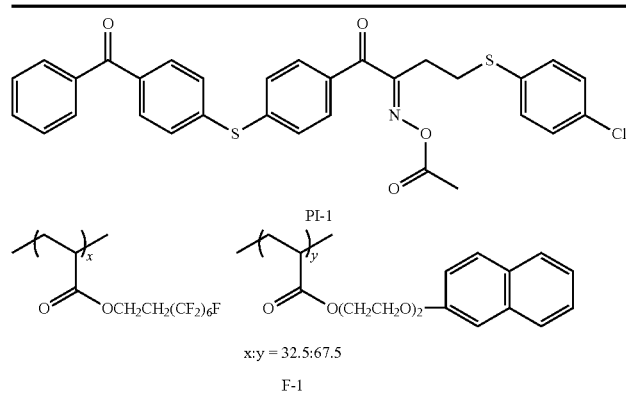

x:y = 32.5:67.5

F-1

A coating liquid for an optically anisotropic film was applied onto a glass substrate with a rubbed polyimide alignment layer (SE-130, manufactured by Nissan Chemical Industries, Ltd.) by spin-coating to form a coating film, which was heated at 240° C. for 1 minute and then cooled to 200° C. Thereafter, nitrogen purge was performed so as to create an atmosphere with an oxygen concentration of 1.0% by volume or less, and the coating film was irradiated with ultraviolet rays at an irradiation dose of 500 ml/cm² using a high-pressure mercury lamp to manufacture an optically anisotropic film 1.

The optical characteristics of the obtained optically anisotropic film 1 were measured using AxoScan OPMF-1 (manufactured by Opto Science, Inc.), and it was thus found that Re(550) was 140 nm, Re(450)/Re(550) was 0.83, and Re(650)/Re(550) was 1.08.

In addition, in a case where absorption in the infrared region was confirmed using a spectrophotometer (MPC-3100 (manufactured by SHIMADZU Corporation)) equipped with a polarizer for infrared rays, it was confirmed that a peak (maximum absorption wavelength: λmax) derived from the near-infrared absorbing coloring agent D-1 was exhibited at 799 nm.

In addition, the degree of $S_0$ of alignment order of the optically anisotropic film 1 at the maximum absorption wavelength of the near-infrared absorbing coloring agent D-1 was 0.31.

Examples 2 to 4

An optically anisotropic film was manufactured in the same manner as in Example 1, except that the near-infrared absorbing coloring agent D-1 in Example 1 was replaced with D-2 to D-4. The optical characteristics of the obtained optically anisotropic film are shown in Table 1 below.

Comparative Example 1

An optically anisotropic film was manufactured in the same manner as in Example 1 except that the near-infrared absorbing coloring agent D-1 in Example 1 was removed. The optical characteristics of the obtained optically anisotropic film are shown in Table 1 below.

Comparative Examples 2 and 3

An optically anisotropic film was manufactured in the same manner as in Example 1, except that the near-infrared absorbing coloring agent D-1 in Example 1 was replaced with each of D-5 and D-6. The optical characteristics of the obtained optically anisotropic film are shown in Table 1 below.

In Table 1, the "Angle" column shows an angle between the direction of the transition moment of absorption of the infrared absorbing coloring agent and the direction of the eigenvector of the first eigenvalue.

TABLE 1

| | Compound | λ2/λ1 | Angle | λmax | ε(650)/ε(λmax) | Degree of alignment order | Re(450)/Re(550) | Re(650)/Re(550) |
|---|---|---|---|---|---|---|---|---|
| Example 1 | D-1 | 0.50 | 88.3° | 799 nm | 0.030 | 0.31 | 0.83 | 1.08 |
| Example 2 | D-2 | 0.44 | 89.6° | 785 nm | 0.036 | 0.25 | 0.84 | 1.07 |
| Example 3 | D-3 | 0.32 | 84.5° | 800 nm | 0.032 | 0.44 | 0.84 | 1.09 |
| Example 4 | D-4 | 0.45 | 82.5° | 883 nm | 0.001 | 0.41 | 0.85 | 1.07 |
| Comparative Example 1 | — | — | — | — | — | — | 0.82 | 1.04 |
| Comparative Example 2 | D-5 | 0.50 | 70.0° | 794 am | 0.032 | −0.11 | 0.84 | 1.01 |
| Comparative Example 3 | D-6 | 0.73 | 56.6° | 800 nm | 0.031 | 0.10 | 0.84 | 1.05 |

As shown in Table 1 above, it could be seen that by using a near-infrared absorbing coloring agent in which λ2/λ1 is 0.60 or less and the angle between the transition moment and the first eigenvector is 75.0° or more, the degree of alignment of the near-infrared absorbing coloring agent is improved, and an optically anisotropic film having excellent reverse wavelength dispersibility can be obtained.

Furthermore, in a case where the value of Re(450)/Re (550) is 0.85 or less and the value of Re(650)/Re(550) is 1.07 or more, the reverse wavelength dispersibility is excellent.

A polyvinyl alcohol film having a thickness of 80 μm was dyed by immersing the film in an aqueous iodine solution at an iodine concentration of 0.05% by mass at 30° C. for 60 seconds. Subsequently, the obtained film was vertically stretched five times its original length while the film was immersed in an aqueous boric acid solution (boric acid concentration: 4% by mass) for 60 seconds, and then the vertically stretched film was dried at 50° C. for 4 minutes to obtain a polarizer having a thickness of 2.0 μm.

A commercially available cellulose acylate-based film "TD80UL" (manufactured by Fujifilm Corporation) was prepared and immersed in an aqueous sodium hydroxide solution at 1.5 mol/liter at 55° C., and then the obtained film was sufficiently washed with water to remove sodium hydroxide.

Thereafter, the obtained film was immersed in a diluted aqueous sulfuric acid solution at 0.005 mol/liter at 35° C. for one minute, then the obtained film was immersed in water, and the diluted aqueous sulfuric acid solution on the film was sufficiently washed off. Thereafter, the washed film was dried at 120° C. to manufacture a protective film for a polarizer.

The protective film for a polarizer manufactured above was bonded to one surface of the polarizer manufactured above with a polyvinyl alcohol-based adhesive to manufacture a polarizing plate including the polarizer and the protective film for a polarizer arranged on one surface of the polarizer.

A pressure sensitive adhesive (SK-2057, manufactured by Soken Chemical & Engineering Co., Ltd.) was applied onto the polarizer (having no protective film for a polarizer) side in the polarizing plate manufactured above to form a pressure sensitive adhesive layer, and the optically anisotropic film manufactured in each of Examples was bonded thereto such that the pressure sensitive adhesive layer and the optically anisotropic layer were adhered to each other, thereby manufacturing a circularly polarizing plate. In addition, the angle formed between the slow axis of the optically anisotropic film and the transmission axis of the polarizer was set to 45°.

Galaxy S4 (manufactured by Samsung) was disintegrated and a part of an antireflection film bonded to the product was peeled and used as a light emitting layer. The circularly polarizing plate manufactured above was bonded to the light emitting layer via a pressure sensitive adhesive while preventing air permeation, thereby manufacturing an organic electroluminescence (EL) display device.

What is claimed is:

1. A composition comprising:
  a liquid crystal compound or a polymer; and
  a near-infrared absorbing coloring agent having a structural moiety consisting of a coloring agent skeleton and a mesogenic group that is bonded to the coloring agent skeleton,
  wherein the near-infrared absorbing coloring agent satisfies the following Conditions 1 and 2:

Condition 1: coordinate data of atoms in the structural moiety in a most stable molecular structure of the structural moiety of the near-infrared absorbing coloring agent are acquired by computation using a density functional theory, the coordinate data are subjected to main component analysis to determine eigenvalues, and in a case where a first eigenvalue, a second eigenvalue, and a third eigenvalue are set in descending order among the eigenvalues, an absolute value λ1 of a square root of the first eigenvalue and an absolute value λ2 of a square root of the second eigenvalue satisfy a relationship of Formula (A), $$\lambda 2/\lambda 1 \leq 0.60 \qquad \text{Formula (A)}$$

Condition 2: an angle between a direction of a transition moment of absorption of the infrared absorbing coloring agent and a direction of an eigenvector of the first eigenvalue is 75.0° or more.

2. The composition according to claim 1,
  wherein in a case where a light absorption coefficient of the near-infrared absorbing coloring agent at a wavelength of 650 nm is defined as ε(650) and a light absorption coefficient at an absorption maximum wavelength is defined as ε(λmax), ε(650)/ε(λmax) is 0.200 or less.

3. The composition according to claim 1,
  wherein the near-infrared absorbing coloring agent is a compound represented by Formula (1), $$(W—X)_p\text{-D} \qquad \text{Formula (1)}$$

in the formula, D represents a coloring agent skeleton,
W represents a hydrogen atom or a substituent, and
X represents a mesogenic group represented by Formula (2), $$\text{-(A-Z)}_n\text{-A-} \qquad \text{Formula (2)}$$

A's each independently represent a divalent aromatic ring group which may have a substituent or a divalent non-aromatic ring group which may have a substituent,
Z represents a single bond or a divalent linking group,
n represents an integer of 2 to 10,
p represents an integer of 2 or more, and
at least one of W's represents a substituent.

4. The composition according to claim 3,
  wherein Z's each independently represent a group selected from the group consisting of a single bond, —CH$_2$CH$_2$—, —CH$_2$O—, —CH$_2$NR—, —CH═CH—, —CH═N—, —N═N—, —C≡C—, —COO—, —CONR—, —COOCH$_2$CH$_2$—, —CONRCH$_2$CH$_2$—, —OCOCH═CH—, and —C≡C—C≡C—,
R represents a hydrogen atom or an alkyl group having 1 to 6 carbon atoms, and
at least one or more of hydrogen atoms in Z may be substituted with fluorine atoms.

5. The composition according to claim 3,
  wherein at least one of the substituents has a polymerizable group.

6. The composition according to claim 3,
  wherein the near-infrared absorbing coloring agent is a compound represented by Formula (3),

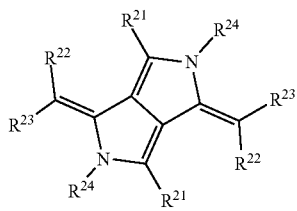

Formula (3)

in the formula, $R^{21}$'s each independently represent a group represented by Formula (4), W—X—*  Formula (4)

W represents a hydrogen atom or a substituent,
X represents a mesogenic group represented by Formula (2),
at least one of W's represents a substituent,
$R^{22}$ and $R^{23}$ each independently represent a hydrogen atom or a substituent, and at least one of $R^{22}$ or $R^{23}$ represents an electron-withdrawing group, and $R^{22}$ and $R^{23}$ may be bonded to each other to form a ring, and
$R^{24}$'s each independently represent a hydrogen atom, an alkyl group, an aromatic hydrocarbon ring group, an aromatic heterocyclic group, a substituted boron, or a metal atom, and may be covalently bonded or coordinately bonded with $R^{21}$ and/or $R^{23}$.

7. The composition according to claim 1,
wherein the liquid crystal compound is a reverse wavelength dispersion liquid crystal compound.

8. An optically anisotropic film formed of the composition according to claim 1.

9. A circularly polarizing plate comprising:
the optically anisotropic film according to claim 8; and
a polarizer.

10. A display device comprising:
a display element; and
the circularly polarizing plate according to claim 9, arranged on the display element.

11. A near-infrared absorbing coloring agent comprising a structural moiety consisting of a coloring agent skeleton and a mesogenic group that is bonded to the coloring agent skeleton,
wherein the near-infrared absorbing coloring agent satisfies Conditions 1 and 2:
Condition 1: coordinate data of atoms in the structural moiety in a most stable molecular structure of the structural moiety of the near-infrared absorbing coloring agent are acquired by computation using a density functional theory, the coordinate data are subjected to main component analysis to determine eigenvalues, and in a case where a first eigenvalue, a second eigenvalue, and a third eigenvalue are set in descending order among the eigenvalues, an absolute value λ1 of a square root of the first eigenvalue and an absolute value λ2 of a square root of the second eigenvalue satisfy a relationship of Formula (A), λ2/λ1≤0.60  Formula (A)

Condition 2: an angle between a direction of a transition moment of absorption of the infrared absorbing coloring agent and a direction of an eigenvector of the first eigenvalue is 75.0° or more.

12. The composition according to claim 2,
wherein the near-infrared absorbing coloring agent is a compound represented by Formula (1), $(W—X)_p$-D  Formula (1)

in the formula, D represents a coloring agent skeleton,
W represents a hydrogen atom or a substituent, and
X represents a mesogenic group represented by Formula (2), -(A-Z)$_n$-A-  Formula (2)

A's each independently represent a divalent aromatic ring group which may have a substituent or a divalent non-aromatic ring group which may have a substituent,
Z represents a single bond or a divalent linking group,
n represents an integer of 2 to 10,
p represents an integer of 2 or more, and
at least one of W's represents a substituent.

13. The composition according to claim 12,
wherein Z's each independently represent a group selected from the group consisting of a single bond, —CH$_2$CH$_2$—, —CH$_2$O—, —CH$_2$NR—, —CH=CH—, —CH=N—, —N=N—, —C≡C—, —COO—, —CONR—, —COOCH$_2$CH$_2$—, —CONRCH$_2$CH$_2$—, —OCOCH=CH—, and —C≡C—C≡C—,
R represents a hydrogen atom or an alkyl group having 1 to 6 carbon atoms, and
at least one or more of hydrogen atoms in Z may be substituted with fluorine atoms.

14. The composition according to claim 12,
wherein at least one of the substituents has a polymerizable group.

15. The composition according to claim 12,
wherein the near-infrared absorbing coloring agent is a compound represented by Formula (3),

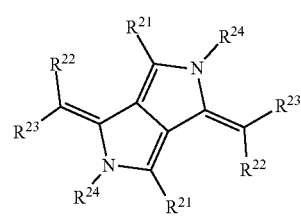

Formula (3)

in the formula, $R^{21}$'s each independently represent a group represented by Formula (4), W—X—*  Formula (4)

W represents a hydrogen atom or a substituent,
X represents a mesogenic group represented by Formula (2),
at least one of W's represents a substituent,
$R^{22}$ and $R^{23}$ each independently represent a hydrogen atom or a substituent, and at least one of $R^{22}$ or $R^{23}$ represents an electron-withdrawing group, and $R^{22}$ and $R^{23}$ may be bonded to each other to form a ring, and
$R^{24}$'s each independently represent a hydrogen atom, an alkyl group, an aromatic hydrocarbon ring group, an aromatic heterocyclic group, a substituted boron, or a metal atom, and may be covalently bonded or coordinately bonded with $R^{21}$ and/or $R^{23}$.

16. The composition according to claim 2,
wherein the liquid crystal compound is a reverse wavelength dispersion liquid crystal compound.

17. An optically anisotropic film formed of the composition according to claim 2.

18. A circularly polarizing plate comprising:
the optically anisotropic film according to claim 17; and
a polarizer.

19. A display device comprising:
a display element; and
the circularly polarizing plate according to claim 18, arranged on the display element.
20. The composition according to claim 4, wherein at least one of the substituents has a polymerizable group.

* * * * *